(12) United States Patent
Kang et al.

(10) Patent No.: US 12,324,271 B2
(45) Date of Patent: Jun. 3, 2025

(54) METHOD OF ALIGNING LIGHT EMITTING ELEMENTS AND METHOD OF MANUFACTURING DISPLAY DEVICE USING THE SAME

(71) Applicant: Samsung Display Co., LTD., Yongin-si (KR)

(72) Inventors: Jong Hyuk Kang, Suwon-si (KR); Won Ho Lee, Suwon-si (KR); Hyun Deok Im, Seoul (KR); Jin Oh Kwag, Yongin-si (KR); Hyun Min Cho, Seoul (KR); Won Kyu Kim, Seoul (KR); Keun Kyu Song, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 775 days.

(21) Appl. No.: 17/278,101

(22) PCT Filed: Jun. 10, 2019

(86) PCT No.: PCT/KR2019/006948
§ 371 (c)(1),
(2) Date: Mar. 19, 2021

(87) PCT Pub. No.: WO2020/060006
PCT Pub. Date: Mar. 26, 2020

(65) Prior Publication Data
US 2021/0273131 A1   Sep. 2, 2021

(30) Foreign Application Priority Data
Sep. 21, 2018   (KR) .......................... 10-2018-0114341

(51) Int. Cl.
*H10H 20/01*   (2025.01)
*H01L 25/075*   (2006.01)

(52) U.S. Cl.
CPC ......... *H10H 20/01* (2025.01); *H01L 25/0753* (2013.01)

(58) Field of Classification Search
CPC ..... H10H 20/01; H01L 25/0753; H01L 24/00; H01L 24/24; H01L 24/82; H01L 24/95;
(Continued)

(56) References Cited

U.S. PATENT DOCUMENTS

| 11,424,230 B2 | 8/2022 | Cho et al. |
| 2011/0058126 A1 * | 3/2011 | Okada .................... H10K 19/10 257/E29.112 |

(Continued)

FOREIGN PATENT DOCUMENTS

| CN | 101783353 | 7/2010 |
| CN | 105989804 | 10/2016 |

(Continued)

OTHER PUBLICATIONS

Partial supplementary European search report for European Patent Application or Patent No. 19861830.8 dated May 5, 2022.

(Continued)

*Primary Examiner* — Su C Kim
(74) *Attorney, Agent, or Firm* — KILE PARK REED & HOUTTEMAN PLLC

(57) ABSTRACT

A method of aligning light emitting elements includes applying a ground voltage to a first electrode and applying a first AC voltage to a second electrode spaced apart from the first electrode; and applying a ground voltage to the first electrode and applying a second AC voltage to the second electrode, wherein the first AC voltage has an asymmetric waveform.

17 Claims, 36 Drawing Sheets

(58) Field of Classification Search
CPC ......... H01L 25/167; H01L 2224/95101; H01L 2224/95133; H01L 2924/12041; A01N 1/146; G09G 2300/0426; G09G 3/3208; G09G 3/3233; G09G 3/32; G09G 2330/00; G09G 2330/028; H10D 8/043
See application file for complete search history.

(56) References Cited

U.S. PATENT DOCUMENTS

| | | | |
|---|---|---|---|
| 2012/0326181 | A1 | 12/2012 | Shibata et al. |
| 2013/0027623 | A1* | 1/2013 | Negishi ............... H01L 25/0753 438/30 |
| 2015/0077172 | A1 | 3/2015 | Lu et al. |
| 2017/0250168 | A1* | 8/2017 | Do .......................... H01L 33/38 |
| 2017/0338372 | A1 | 11/2017 | Teraguchi et al. |
| 2017/0358563 | A1 | 12/2017 | Cho et al. |
| 2018/0012876 | A1 | 1/2018 | Kim et al. |

FOREIGN PATENT DOCUMENTS

| | | |
|---|---|---|
| CN | 107611153 | 1/2018 |
| EP | 2 851 338 | 3/2015 |
| JP | 2011-192722 | 9/2011 |
| JP | 2011-205060 | 10/2011 |
| JP | 2012-4535 | 1/2012 |
| KR | 10-1628345 | 6/2016 |
| KR | 10-1674052 | 11/2016 |
| KR | 10-1730927 | 4/2017 |
| KR | 10-1770632 | 8/2017 |
| KR | 10-1782889 | 9/2017 |
| KR | 10-2017-0141305 | 12/2017 |
| KR | 10-2018-0009014 | 1/2018 |
| KR | 10-2018-0009015 | 1/2018 |
| KR | 10-1874993 | 7/2018 |
| KR | 10-2020-0001648 | 1/2020 |

OTHER PUBLICATIONS

International Search Report, with English translation, corresponding to International Application No. PCT/KR2019/006948 dated Sep. 25, 2019.

Written Opinion, with English translation, corresponding to International Application No. PCT/KR2019/006948, dated Sep. 25, 2019.

* cited by examiner

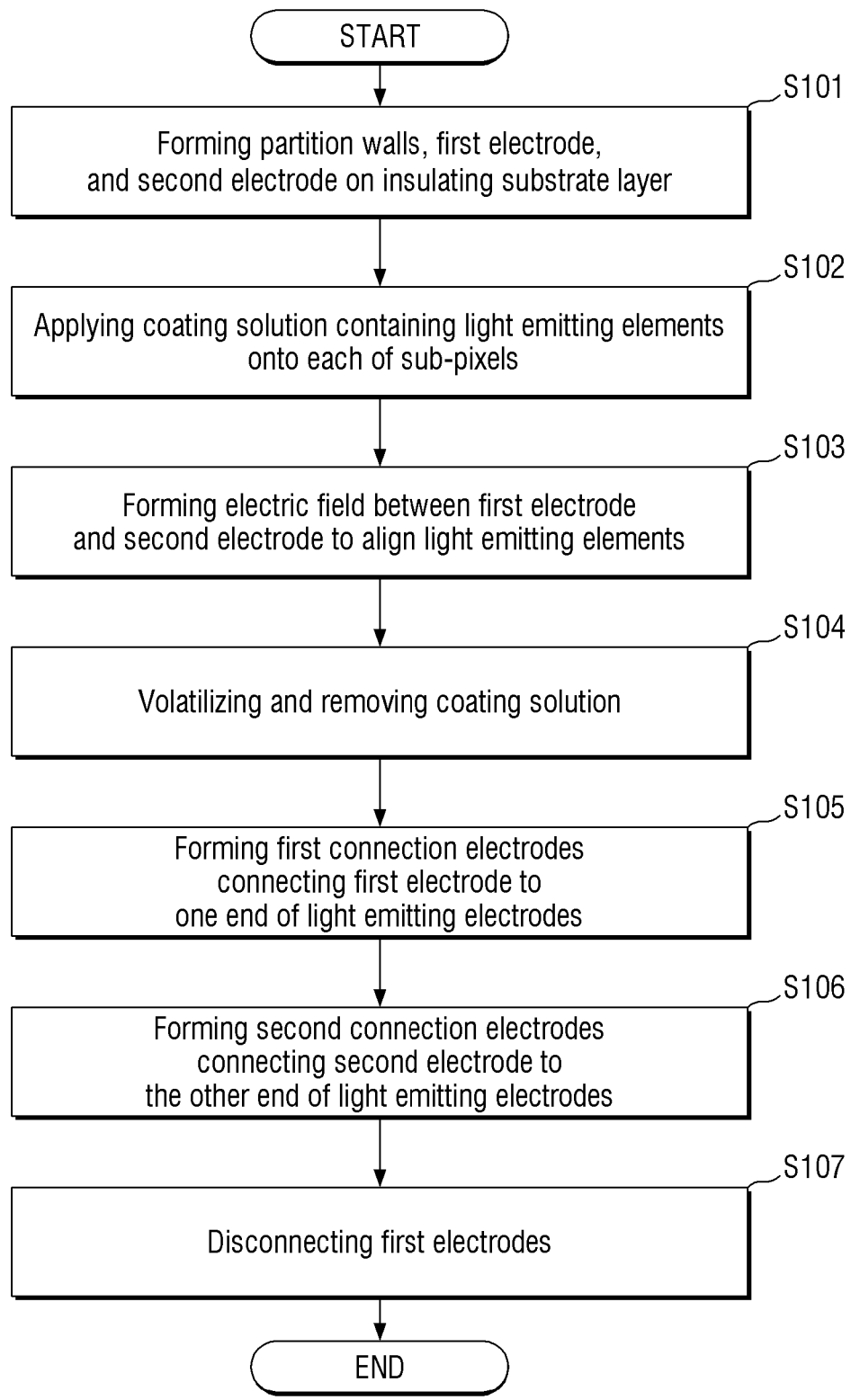

METHOD OF ALIGNING LIGHT EMITTING ELEMENTS AND METHOD OF MANUFACTURING DISPLAY DEVICE USING THE SAME

CROSS-REFERENCE TO RELATED APPLICATIONS

This application is a national entry of International Application No. PCT/KR2019/006948, filed on Jun. 10, 2019, which claims under 35 U.S.C. §§ 119 (a) and 365(b) priority to and benefits of Korean Patent Application No. 10-2018-0114341, filed on Sep. 21, 2018 in the Korean Intellectual Property Office (KIPO), the entire contents of all of which are incorporated herein by reference.

BACKGROUND

1. Technical Field

The invention relates to a method of aligning light emitting elements and a method of manufacturing a display device using the same.

2. Description of Related Art

The importance of a display device has increased with the development of multimedia. Accordingly, various types of display devices such as an organic light emitting display (OLED) and a liquid crystal display (LCD) have been used.

A display device is a device for displaying an image and includes a display panel such as a light emitting display panel or a liquid crystal panel. Among them, the light emitting display panel may display an image by emitting light using light emitting elements. In this case, when a light emitting diode (LED) is used as the light emitting element, an organic light emitting diode (OLED) using an organic material as a fluorescent material or an inorganic light emitting diode using an inorganic material as a fluorescent material may be used as the light emitting element.

In the case of an organic light emitting diode (OLED), there is an advantage that its manufacturing process is simple because it emits light using an organic material as a fluorescent material. However, the organic material, as a fluorescent material, may be vulnerable to high-temperature driving environments, and may have lower efficiency of blue light than that of light having another color.

On the other hand, in the case of an inorganic light emitting diode, there is an advantage that it has durability even in high-temperature environments and has higher efficiency of blue light than an organic light emitting diode because it uses an inorganic semiconductor as a fluorescent material. Therefore, researches on inorganic light emitting diodes having higher durability and efficiency than organic light emitting diodes are being continued.

SUMMARY

The disclosure provides a method of aligning light emitting elements, by which accuracy of alignment of light emitting elements can be increased.

The disclosure also provides a method of manufacturing a display device, by which accuracy of alignment of light emitting elements can be increased.

Additional advantages, subjects, and features of the invention will be set forth in part in the description which follows and in part will become apparent to those having ordinary skill in the art upon examination of the following or may be learned from practice of the invention.

In an aspect, an embodiment provides a method of aligning light emitting elements, comprising applying a ground voltage to a first electrode and applying a first AC voltage to a second electrode spaced apart from the first electrode; and applying a ground voltage to the first electrode and applying a second AC voltage to the second electrode, wherein the first AC voltage may have an asymmetric waveform.

A voltage waveform of a positive polarity region of the first AC voltage and a voltage waveform of a negative polarity region of the first AC voltage may be left-right asymmetric.

The first AC voltage may have a sawtooth waveform or a ramp waveform.

The second AC voltage may have a symmetric waveform.

The voltage waveform of a positive polarity region of the second AC voltage and a voltage waveform of a negative polarity region of the second AC voltage may be left-right symmetric.

The second AC voltage may have a sinusoidal waveform, a spherical waveform, or a triangular waveform.

A driving frequency of the first AC voltage may be lower than a driving frequency of the second AC voltage.

The first AC voltage may have a driving frequency of about 1 Hz to about 1 kHz.

The second AC voltage may have a driving frequency of about 1 kHz to about 100 kHz.

In case that a ground voltage is applied to the first electrode and a first AC voltage is applied to the second electrode spaced apart from the first electrode, an electric field formed by the first electrode and the second electrode may be an asymmetric electric field in which any one of positive polarity and negative polarity is dominant.

In case that a ground voltage is applied to the first electrode and a second AC voltage is applied to the second electrode, an electric field formed by the first electrode and the second electrode may be a symmetric electric field.

In an aspect, an embodiment provides a method of manufacturing a display device, comprising forming a partition wall, a first electrode and a second electrode on a substrate; applying a coating solution including light emitting elements onto sub-pixels; forming an electric field between the first electrode and the second electrode to align the light emitting elements; volatilizing and removing the coating solution; forming first connection electrodes electrically connecting the first electrode to an end of each of the light emitting elements; and forming second connection electrodes electrically connecting the second electrode to another end of each of the light emitting elements, wherein the forming of the electric field between the first electrode and the second electrode to align the light emitting elements may include applying a ground voltage to the first electrode, and applying a first AC voltage having an asymmetric waveform to the second electrode.

In case that a ground voltage is applied to the first electrode and a first AC voltage is applied to the second electrode, the light emitting elements may be disposed (or deflected) toward the first electrode.

Each of the light emitting elements may include a first conductive semiconductor disposed at the another end of each of the light emitting elements; and a second conductive semiconductor disposed at the end of each of the light emitting elements, wherein the first conductive semiconductor may be disposed adjacent to the second electrode, and the second conductive semiconductor may be disposed adjacent to the first electrode.

The first conductive semiconductor may be an n-type semiconductor layer, and the second conductive semiconductor may be a p-type semiconductor layer.

The forming of the electric field between the first electrode and the second electrode to align the light emitting elements may further include applying a ground voltage to the first electrode, and applying a second AC voltage to the second electrode.

In case that a ground voltage is applied to the first electrode and a second AC voltage is applied to the second electrode, the light emitting elements may be aligned toward a center between the first electrode and the second electrode.

The second AC voltage may have a symmetric waveform.

A driving frequency of the first AC voltage may be lower than a driving frequency of the second AC voltage.

The method may further comprise electrically disconnecting the first electrode after forming the second connection electrodes to form a first electrode for each of the sub-pixels.

The removing of the coating solution includes volatilizing the coating solution.

According to a method of aligning light emitting elements and a method of manufacturing a display device, an asymmetric electric field can be formed by applying a first AC voltage having an asymmetric waveform to a second electrode, and thus light emitting elements may be disposed (or deflected) toward a first electrode such that first conductive semiconductors of the light emitting elements are arranged toward the first electrode. Then, a symmetric electric field can be formed by applying a second AC voltage having a symmetric waveform to the second electrode, and thus the light emitting elements disposed toward the first electrode can be aligned at the center between the first electrode and the second electrode. Therefore, accuracy of alignment of the light emitting elements can be increased.

The effects of the disclosure are not limited to the above-described effects, and other unmentioned effects will be clearly understood to those skilled in the art from the description of claims.

BRIEF DESCRIPTION OF THE DRAWINGS

An additional appreciation according to the embodiments of the invention will become more apparent by describing in detail the embodiments thereof with reference to the accompanying drawings, wherein:

FIG. 8 is a flowchart illustrating a method of manufacturing a display device according to an embodiment;

DETAILED DESCRIPTION OF THE EMBODIMENTS

Figure 1:
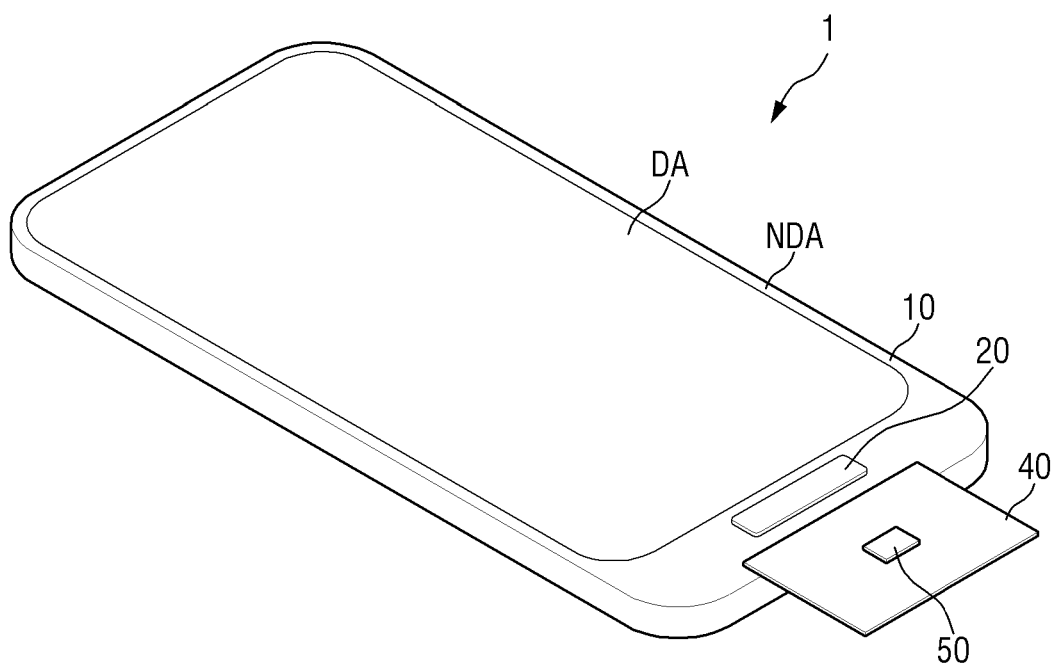
FIG. 1 is a perspective view schematically illustrating a display device according to an embodiment.

Advantages and features of the disclosure, and a method of achieving them will become apparent with reference to the embodiments described below in detail together with the accompanying drawings. However, the disclosure is not limited to the embodiments disclosed below, but will be implemented in a variety of different forms, and only these embodiments make the disclosure more complete, and the general knowledge in the technical field to which the disclosure pertains. It is provided to inform the scope of the invention to those who have it, and the claimed invention is only defined by the scope of the claims.

When elements or layers are referred to as "on" of another element or layer includes all cases where another layer or other element is interposed directly on or in the middle of another element. The same reference numerals refer to the same components throughout the specification. The shapes, sizes, ratios, angles, numbers, etc. disclosed in the drawings for describing the embodiments are examples, and the disclosure is not limited to the illustrated matters.

Although the first, second, and the like are used to describe various elements, it goes without saying that these elements are not limited by these terms. These terms are only used to distinguish one component from another component. Therefore, it goes without saying that the first component mentioned below may be the second component within the technical idea of the disclosure.

Each of the features of the various embodiments of the disclosure can be partially or entirely combined or combined with each other, technically various interlocking and driving are possible, and each of the embodiments can be implemented independently of each other or can be implemented together in a related relationship.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, some embodiments of the disclosure will be described in detail with reference to the accompanying drawings. Hereinafter, a display device 1 according to an embodiment will be described assuming that it is an inorganic light emitting display device using an inorganic light emitting diode including an inorganic semiconductor as a light emitting element.

Figure 2:
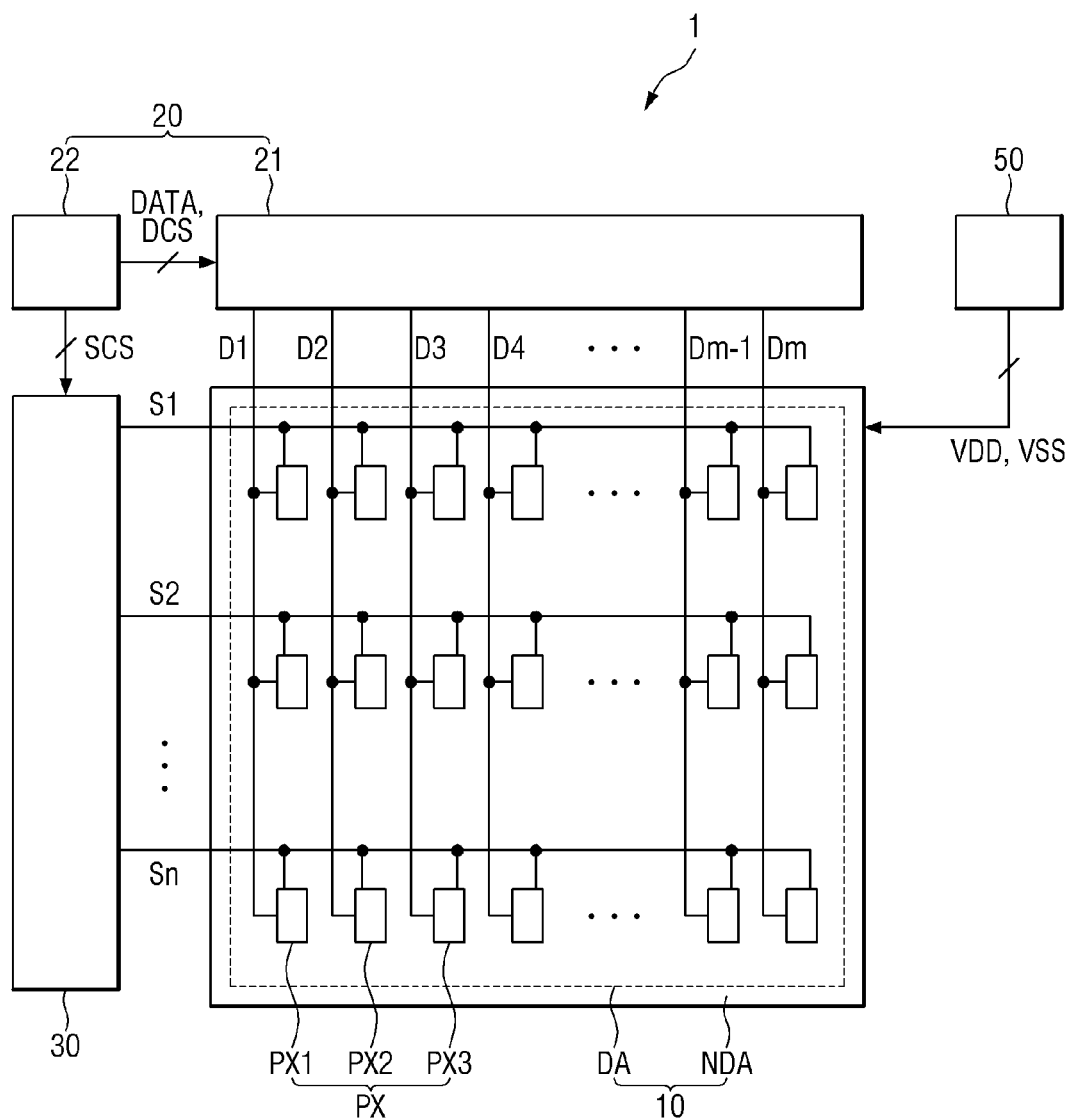
FIG. 2 is a block diagram schematically illustrating a display device according to an embodiment.
Figure 3:
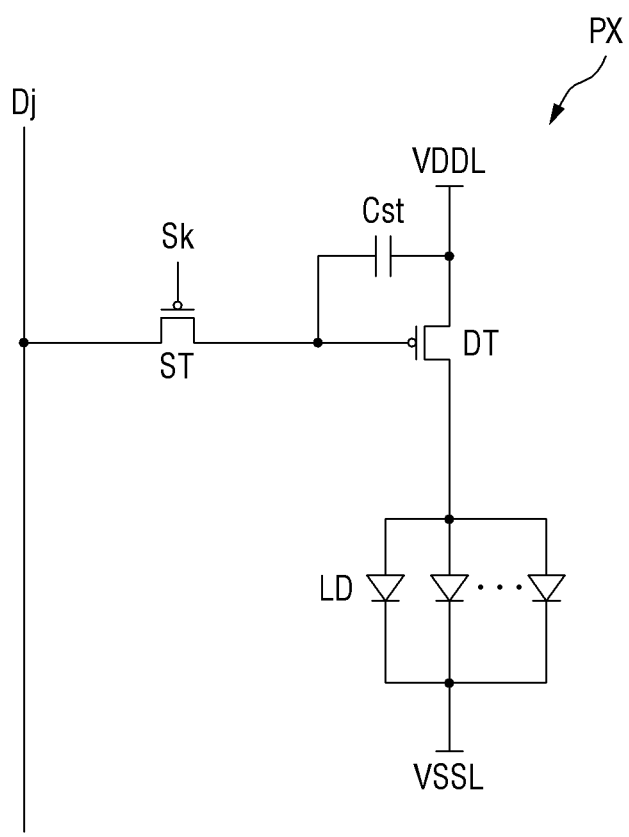
FIG. 3 is a circuit diagram schematically illustrating an example of the pixel of FIGS. 1 and 2.

FIG. 1 is a schematic perspective view illustrating a display device according to an embodiment. FIG. 2 is a block diagram schematically illustrating a display device according to an embodiment. FIG. 3 is a circuit diagram illustrating a pixel of FIGS. 1 and 2.

Referring to FIGS. 1 to 3, a display device 1 according to an embodiment may include a display panel 10, an integrated driving circuit 20, a scan driver 30, a circuit board 40, and a power supply circuit 50. The integrated driving circuit 20 may include a data driver 21 and a timing controller 22.

In this specification, the "on", "over", "top", "upper side", or "upper surface" refers to a Z-direction, and the "beneath", "under", "bottom", "lower side", or "lower surface" refers to a direction opposite to the Z-direction. Further, the "left", "right", "upper", and "lower" refer to respective directions when the display panel 10 is viewed in a plan view. For example, the "left" refers to a direction opposite to the X-direction, the "right" refers to the X-direction, the "upper" refers to the Y-direction, and the "lower" refers to a direction opposite to the Y-direction.

The display panel 10 may have a rectangular shape in a plan view. For example, the display panel 10 may have a rectangular planar shape having short sides in the first direction (X-direction) and long sides in the second direction (Y-direction) as shown in FIG. 1. The corner where the short side in the first direction (X-direction) meets the long side in the second direction (Y-direction) may be formed to have a right angle shape or have a round shape of a predetermined curvature. The planar shape of the display panel 10 is not limited to a rectangular shape, and may be formed in another polygonal shape, circular shape, or elliptical shape. Further, although it is illustrated in FIG. 1 that the display panel 10 is formed to be flat, the disclosure is not limited thereto. At least one side of the display panel 10 may be formed to be bent at a predetermined curvature.

The display panel 10 may be divided into a display area DA and a non-display area NDA disposed around the display area DA. Referring to FIG. 2, the display area DA is an area where pixels PX are formed to display an image. The display panel 10 may include data lines D1 to Dm (m is an integer of 2 or greater), scan lines S1 to Sn (n is an integer of 2 or greater) intersecting the data lines D1 to Dm, a high-potential voltage line VDDL to which a high-potential voltage is supplied, a low-potential voltage line VSSL to which a low-potential voltage is supplied, and pixels PX electrically connected to the data lines D1 to Dm and the scan lines S1 to Sn.

Each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be red, the second color may be green, and the third color may be blue, but the disclosure is not limited thereto. Further, although it is shown in FIG. 2 that each of the pixels PX includes three sub-pixels, the disclosure is not limited thereto. For example, each of the pixels PX may include four or more sub-pixels.

Each of the first sub-pixel PX1, the second sub-pixel PX2, and the third sub-pixel PX3 may be electrically connected to at least one of the data lines D1 to Dm, at least one of the scan lines S1 to Sn, and the high-potential voltage line VDDL. As shown in FIG. 3, the first sub-pixel PX1 may include light emitting elements LD and transistors and at least one capacitor for supplying a current to the light emitting elements LD.

Each of the light emitting elements LD may be an inorganic light emitting diode including a first electrode, an inorganic semiconductor, and a second electrode. Here, the first electrode may be an anode electrode, and the second electrode may a cathode electrode.

As shown in FIG. 3, the transistors may include a driving transistor DT for supplying a current to the light emitting elements LD and a scan transistor ST for supplying a data voltage to a gate electrode of the driving transistor DT. The driving transistor DT may include a gate electrode electrically connected to a source electrode of the scan transistor ST, a source electrode electrically connected to the high-potential voltage line VDDL to which a high-potential voltage is applied, and a drain electrode connected to the first electrodes of the light emitting elements LD. The scan transistor ST may include a gate electrode electrically connected to a scan line Sk (where 1≤k≤n), a source electrode electrically connected to the gate electrode of the driving transistor DT, and a drain electrode electrically connected to a data line Dj (where 1≤j≤m).

The capacitor is a storage capacitor Cst, and is formed between the gate electrode and source electrode of the driving transistor DT. The storage capacitor Cst stores a difference voltage between the gate electrode and source electrode of the driving transistor DT.

Each of the driving transistor DT and the scan transistor ST may be formed of a thin film transistor. Although it is illustrated in FIG. 3 that each of the driving transistor DT and the scan transistor ST may be formed of a P-type metal oxide semiconductor field effect transistor (MOSFET), the disclosure is not limited thereto. Each of the driving transistor DT and the scan transistor ST may also be formed of an N-type MOSFET. In this case, the positions of the source electrode and drain electrode of each of the driving transistor DT and the scan transistor ST may be changed.

Further, although it is illustrated in FIG. 3 that each of the first sub-pixel PX1, the second sub-pixel PX2, and the third sub-pixel PX3 may be a 2T1C (2 transistor-1 capacitor) including a driving transistor DT, a scan transistor ST, and a capacitor Cst, the disclosure is not limited thereto. Each of the first sub-pixel PX1, the second sub-pixel PX2, and the third sub-pixel PX3 may include multiple scan transistors ST and multiple capacitors Cst.

Since the second sub-pixel PX2 and the third sub-pixel PX3 may be represented by substantially the same circuit diagram as the first sub-pixel PX1, a detailed description thereof will be omitted.

The integrated drive circuit 20 outputs signals and voltages for driving the display panel 10. For this purpose, the integrated driving circuit 20 may include a data driver 21 and a timing controller 22.

The data driver 21 receives digital video data and a source control signal DCS from the timing controller 22. The data driver 21 converts the digital video data into analog data voltages in response to the source control signal DCS, and supplies the analog data voltages to the data lines D1 to Dm.

The timing controller 22 receives digital video data and timing signals from a host system. The timing signals may include a vertical synchronization signal, a horizontal synchronization signal, a data enable signal, and a dot clock. The host system may be an application processor of a smart phone or a tablet PC, or a system on chip of a monitor or a TV.

The timing controller 22 generates control signals for controlling the operation timings of the data driver 21 and the scan driver 30. The control signals may include a source control signal DCS for controlling the operation timing of the data driver 21 and a scan control signal SCS for controlling the operation timing of the scan driver 30.

The integrated driving circuit 20 may be disposed in the non-display area NDA provided at a side of the display panel 10. The integrated driving circuit 20 may be formed as an integrated circuit (IC), and mounted on the display panel 10 using a chip on glass (COG) method, a chip on plastic (COP) method, or an ultrasonic bonding method. However, the disclosure is not limited thereto. For example, the integrated driving circuit 20 may be mounted on the circuit board 40, not on the display panel 10.

Further, although it is illustrated in FIG. 1 that the integrated driving circuit 20 includes the data driver 21 and the timing controller 22, the disclosure is not limited thereto. The data driver 21 and the timing controller 22 may not be integrated into one integrated circuit but may be formed as separate integrated circuits. In this case, the data driver 21 may be mounted on the display panel 10 by a chip on glass (COG) method, a chip on plastic (COP) method, or an ultrasonic bonding method, and the timing controller 22 may be mounted on the circuit board 40.

The scan driver 30 receives the scan control signal SCS from the timing controller 22. The scan driver 30 generates scan signals in response to the scan control signal SCS and supplies the scan signals to the scan lines S1 to Sn of the display panel 10. The scan driver 30 may include transistors and may be formed in the non-display area NDA of the display panel 10. As another example, the scan driver 30 may be formed as an integrated circuit, and, in this case, may be mounted on a gate flexible film attached to the another of the display panel 10.

The circuit board 40 may be attached onto pads provided on a side edge of the display panel 10 using an anisotropic conductive film. Thus, lead lines of the circuit board 40 may be electrically connected to the pad(s). The circuit board 40 may be a flexible printed circuit board, a printed circuit board, or a flexible film such as a chip on film. The circuit board 40 may be bent downward from the display panel 10. Thus, a side of the circuit board 40 may be attached to a side edge of the display panel 10, and another side thereof may be disposed under the display panel 10 to be electrically connected to a system board on which the host system is mounted.

The power supply circuit 50 may generate voltages required for driving the display panel 10 from a main power source provided from the system board and may supply the generated voltages to the display panel 10. For example, the power supply circuit 50 generates a high-potential voltage VDD and a low-potential voltage VSS for driving the light emitting elements LD of the display panel 10 from the main power source and may supply the generated high-potential voltage VDD and low-potential voltage VSS to the high-potential voltage line VDDL and the low-potential voltage line VSSL. Further, the power supply circuit 50 may also generate and supply driving voltages for driving the integrated driving circuit 20 and the scan driver 30 from the main power source.

Although it is illustrated in FIG. 1 that the power supply circuit 50 is formed as an integrated circuit and mounted on the circuit board 40, the embodiments are not limited thereto. For example, the power supply circuit 50 may be formed integrally with the integrated drive circuit 20.

Figure 4:
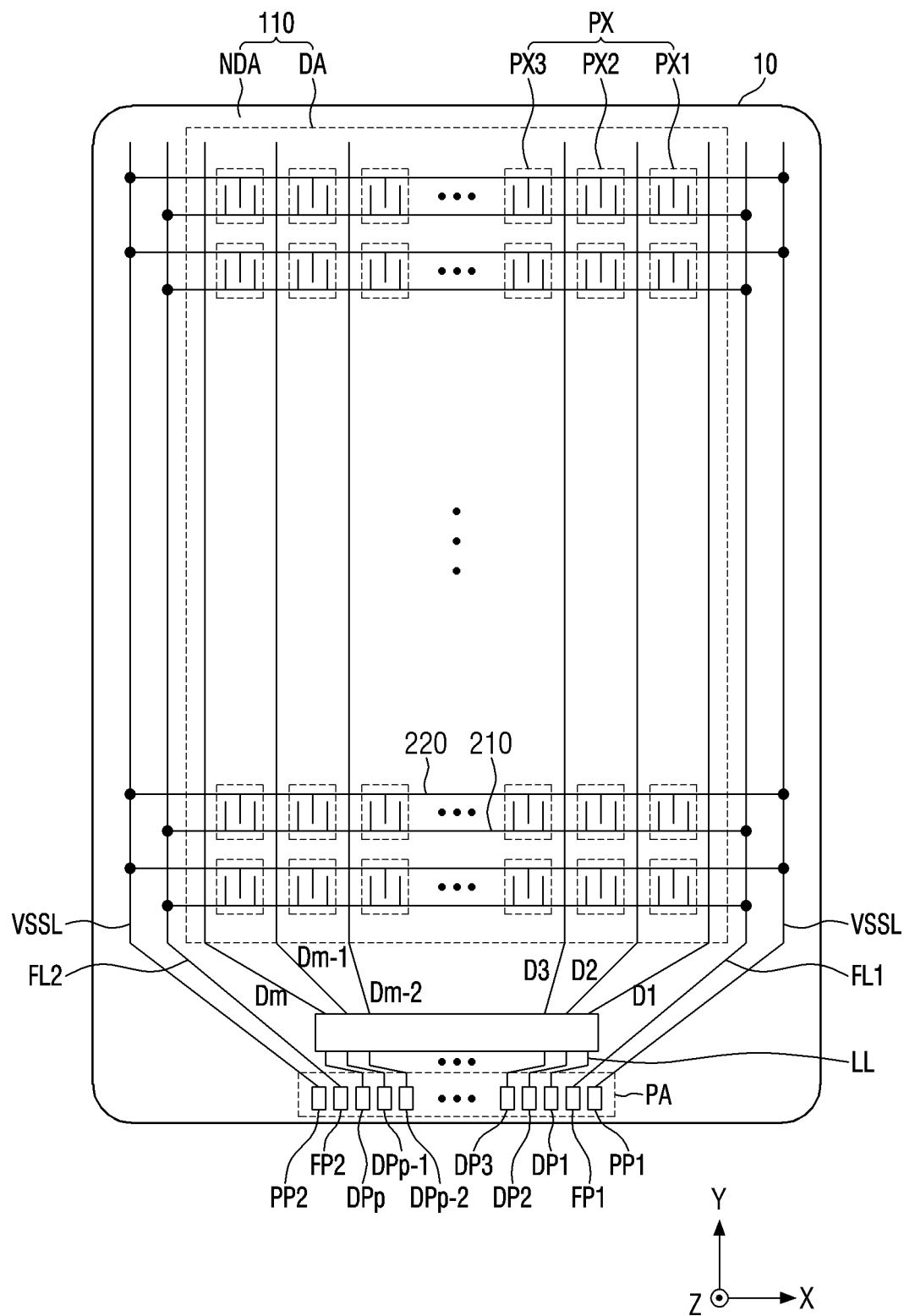
FIG. 4 is a plan view specifically illustrating the display panel of FIG. 1.

FIG. 4 is a plan view specifically illustrating the display panel of FIG. 1. For convenience of explanation, FIG. 4 shows data pads DP1 to DPp (p is an integer of 2 or greater), floating pads FP1 and FP2, power pads PP1 and PP2, floating lines FL1 and FL2, a low-potential voltage line VSSL, data lines D1 to Dm, first electrodes 210, and second electrodes 220.

Referring to FIG. 4, the data lines D1 to Dm, the first electrodes 210, the second electrodes 220, and the pixels PX may be arranged in the display area DA of the display panel 10.

The data lines D1 to Dm may extend in the second direction (Y-direction). A side of each of the data lines D1 to Dm may be electrically connected to the integrated driving circuit 20. Thus, data voltages from the integrated driving circuit 20 may be applied to the data lines D1 to Dm.

The first electrodes 210 may be spaced apart from each other by a predetermined distance in the first direction (X-direction). Thus, the first electrodes 210 may not overlap the data lines D1 to Dm. Among the first electrodes 210, the first electrodes 210 disposed at the right edge of the display area DA may be electrically connected to the first floating line FL1 in the non-display area NDA and the first electrodes 210 disposed at the left edge of the display area DA may be electrically connected to the second floating line FL2 in the non-display area NDA.

The second electrodes 220 may extend in the first direction (X-direction). Thus, the second electrodes 220 may overlap the data lines D1 to Dm. Further, the second electrodes 220 may be electrically connected to the low potential voltage line VSSL in the non-display area NDA. Thus, a low potential voltage of the low potential voltage line VSSL may be applied to the second electrodes 220.

Each of the pixels PX may include a first sub-pixel PX1, a second sub-pixel PX2, and a third sub-pixel PX3.

The first sub-pixel PX1, second sub-pixel PX2 and third sub-pixel PX3 of each of the pixels PX may be arranged in regions defined in a matrix form by the first electrodes 210, the second electrodes 220, and the data lines D1 to Dm. Although it is shown in FIG. 4 that each of the pixels PX includes three sub-pixels, the electrically is not limited thereto. For example, each of the pixels PX may include four or more sub-pixels.

The first sub-pixel PX1, second sub-pixel PX2, and third sub-pixel PX3 of each of the pixels PX may be arranged in the first direction (X-direction), but the disclosure is not limited thereto. For example, the first sub-pixel PX1, second sub-pixel PX2, and third sub-pixel PX3 of each of the pixels PX may be arranged in the second direction (Y-direction) or may be arranged in a zigzag form (or pattern) or in other various forms.

The first sub-pixel PX1 may emit light of a first color, the second sub-pixel PX2 may emit light of a second color, and the third sub-pixel PX3 may emit light of a third color. The first color may be red, the second color may be green, and the third color may be blue, but the disclosure is not limited thereto.

A pad unit PA including data pads DP1 to DPp, floating pads FP1 and FP2, and power pads PP1 and PP2, an integrated driving circuit 20, a first floating line FL1, a second floating line FL2, and a low-potential voltage line VSSL may be arranged in the non-display area NDA of the display panel 10.

The pad unit PA may be disposed at a side edge of the display panel 10, for example, at the lower side edge of the display panel 10. The data pads DP1 to DPp, the floating pads FP1 and FP2, and the power pads PP1 and PP2 may be arranged in parallel in the first direction (X-direction) in the pad unit PA.

The circuit board 40 may be disposed on and electrically connected to the data pads DP1 to DPp, the floating pads FP1 and FP2, and the power pads PP1 and PP2 using an anisotropic conductive film.

The integrated drive circuit 20 may be electrically connected to the data pads DP1 to DPp through link lines LL. The integrated driving circuit 20 may receive digital video data and timing signals through the data pads DP1 to DPp. The integrated driving circuit 20 may convert the digital video data into analog data voltages and supply the analog data voltages to the data lines D1 to Dm of the display panel 10.

The low-potential voltage line VSSL may be electrically connected to the first power pad PP1 and second power pad PP2 of the pad unit PA. The low-potential voltage line VSSL may extend in the second direction (Y-direction) in the non-display area NDA located at the left and right edges of the display area DA. The low-potential voltage line VSSL may be electrically connected to the second electrode 220. Thus, the low-potential voltage of the power supply circuit 50 may be applied to the second electrode 220 through the circuit board 40, the first power pad PP1, the second power pad PP2, and the low-potential voltage line VSSL.

The first floating line FL1 may be electrically connected to the first floating pad FP1 of the pad unit PA. The first floating line FL1 may extend in the second direction (Y-direction) in the non-display area NDA located at the right edge of the display area DA. The first floating pad FP1 and the first floating line FL1 may be a dummy pad and a dummy line to which no voltage is applied.

The second floating line FL2 may be electrically connected to the second floating pad FP2 of the pad unit PA. The second floating line FL2 may extend in the second direction (Y-direction) in the non-display area NDA located at the left edge of the display area DA. The second floating pad FP2 and the second floating line FL2 may be a dummy pad and a dummy line to which no voltage is applied, respectively.

In order to align light emitting elements 300 during a manufacturing process, an electric field may be applied to the first sub-pixel PX1, second sub-pixel PX2, and third sub-pixel PX3 of each of the pixels PX. Specifically, the light emitting elements 30 may be aligned by applying a dielectrophoretic force to the light emitting elements 30 using dielectrophoresis during the manufacturing process. In order to align the light emitting elements 30 using dielectrophoresis during the manufacturing process, a ground voltage is applied to the first electrodes 210, and an AC voltage is applied to the second electrodes 220.

However, it is difficult to apply a ground voltage to the first electrodes 210 by driving thin film transistors during the manufacturing process. Therefore, in the completed display device 1, the first electrodes 210 are arranged at a predetermined interval in the first direction (X-direction), but, during the manufacturing process, the first electrodes 210 may extend in the first direction (X-direction) without being disconnected. Thus, during the manufacturing process, the first electrodes 210 may be electrically connected to the first floating line FL1 and the second floating line FL2. Therefore, the first electrodes 210 may receive a ground voltage through the first floating line FL1 and the second floating line FL2. Accordingly, the first electrodes 210 may be spaced apart from each other at a predetermined interval in the first direction (X-direction) by aligning the light emitting elements 300 using dielectrophoresis and then disconnecting the first electrodes 210 during the manufacturing process. Details thereof will be described below with reference to FIG. 8.

During the manufacturing process, the first floating line FL1 and the second floating line FL2 are used to apply a ground voltage. However, in the completed display device, no voltage may be applied thereto. As another example, in order to prevent static electricity in the completed display device, a ground voltage may be applied to the first floating line FL1 and the second floating line FL2.

Figure 5:
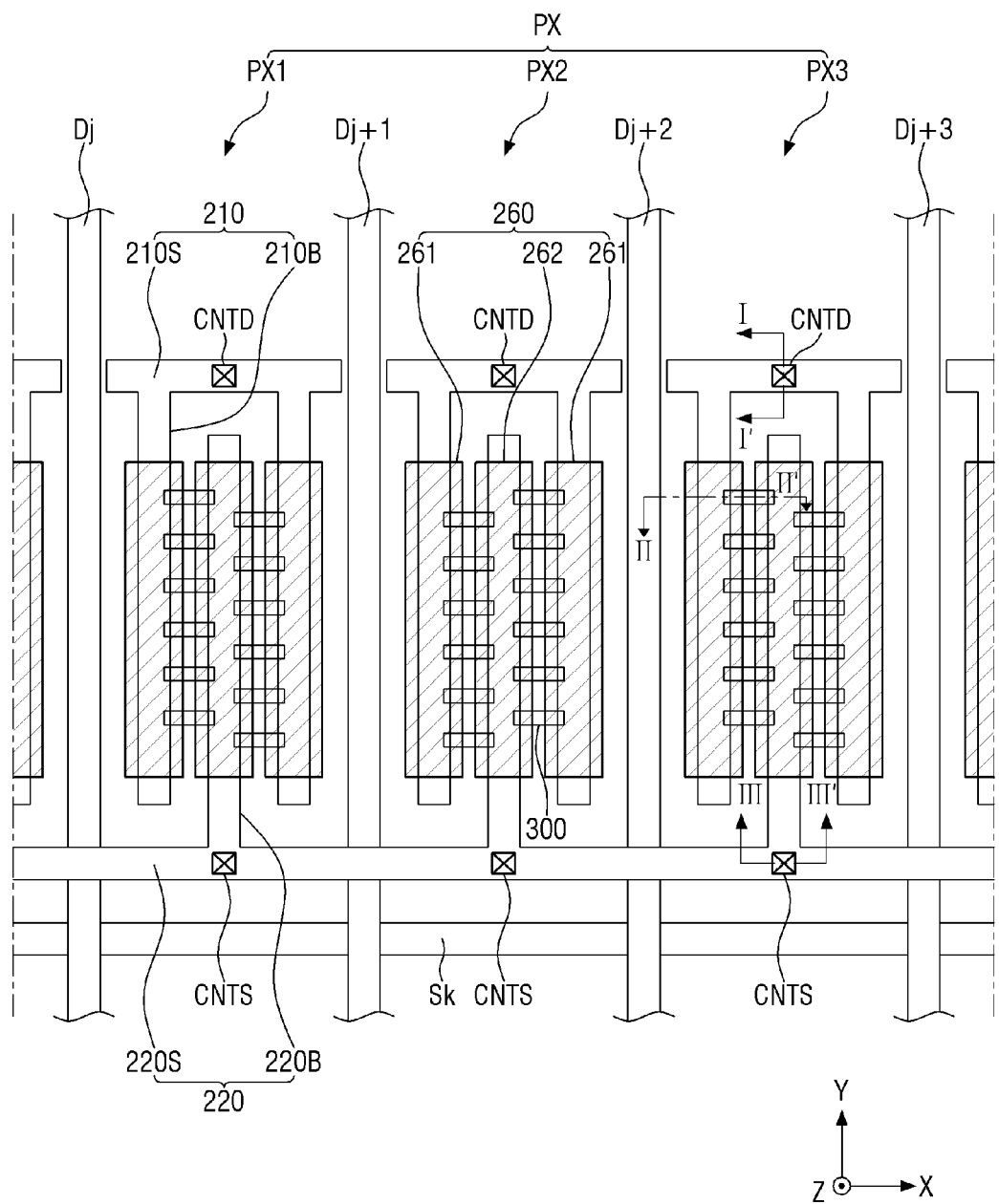
FIG. 5 is a plan view specifically illustrating the pixels of the display area of FIG. 4.

FIG. 5 is a schematic plan view specifically illustrating the pixels of the display area of FIG. 4.

Referring to FIG. 5, each of the pixels PX may include a first sub-pixel PX1, a second sub-pixel PX2, and a third sub-pixel PX3. The first sub-pixel PX1, second sub-pixel PX2, and third sub-pixel PX3 of each of the pixels PX may be arranged in a matrix form in regions defined by an intersection structure of scan lines Sk and data lines Dj, Dj+1, Dj+2, and Dj+3. The scan lines Sk may be extended in a first direction (X-direction), and the data lines Dj, Dj+1, Dj+2, and Dj+3 may be extended in a second direction (Y-direction) intersecting the first direction (X-direction).

Each of the first sub-pixel PX1, the second sub-pixel PX2, and the third sub-pixel PX3 may include a first electrode 210, a second electrode 220 and multiple light emitting elements 300. The first electrode 210 and the second electrode 220 may be electrically connected to the light emitting elements 300 and may receive a voltage to allow the light emitting elements 300 to emit light.

The first electrode 210 of any sub-pixel may be spaced apart from the first electrode 210 of a sub-pixel adjacent thereto. For example, the first electrode 210 of the first sub-pixel PX1 may be spaced apart from the first electrode 210 of the second sub-pixel PX2 adjacent thereto. Further, the first electrode 210 of the second sub-pixel PX2 may be spaced apart from the first electrode 210 of the third sub-pixel PX3 adjacent thereto. Further, the first electrode 210 of the third sub-pixel PX3 may be spaced apart from the first electrode 210 of the first sub-pixel PX1 adjacent thereto.

In contrast, the second electrode 220 of any one sub-pixel may be connected to the second electrode 220 of a sub-pixel adjacent thereto. For example, the second electrode 220 of the first sub-pixel PX1 may be electrically connected to the second electrode 210 of the second sub-pixel PX2 adjacent thereto. Further, the second electrode 220 of the second sub-pixel PX2 may be electrically connected to the second electrode 220 of the third sub-pixel PX3 adjacent thereto. Further, the second electrode 220 of the third sub-pixel PX3 may be electrically connected to the second electrode 220 of the first sub-pixel PX1 adjacent thereto.

In order to align light emitting elements 300 during a manufacturing process, the first electrode 210 and the second electrode 220 may be used to apply an electric field to each of the first sub-pixel PX1, second sub-pixel PX2, and third sub-pixel PX3. Specifically, the light emitting elements 30 may be aligned by applying a dielectrophoretic force to the light emitting elements 30 using dielectrophoresis during the manufacturing process. In order to align the light emitting elements 30 using dielectrophoresis during the manufacturing process, a ground voltage is applied to the first electrodes 210, and an AC voltage is applied to the second electrodes 220. In this case, a capacitance is formed by the electric field, thereby applying the dielectrophoretic force to the light emitting elements 300.

The first electrode 210 may be an anode electrode electrically connected to a second conductive semiconductor of the light emitting elements 300, and the second electrode 220 may be a cathode electrode electrically connected to a first conductive semiconductor of the light emitting elements 300. The first conductive semiconductor of the light emitting elements 300 may be an n-type semiconductor layer, and the second conductive semiconductor thereof may be a p-type semiconductor layer. However, the disclosure is not limited thereto, and the first electrode 210 may be a cathode electrode, and the second electrode 220 may be an anode electrode.

The first electrode 210 may include a stem portion 210S extending in the first direction (X-direction) and at least one first electrode branch portion 210B branched from the first electrode stem portion 210S in the second direction (Y-direction). The second electrode 220 may include a second electrode stem portion 220S extending in the first direction (X-direction) and at least one second electrode branch portion 220B branched from the second electrode stem portion 220S in the second direction (Y-direction).

The first electrode stem portion 210S may be electrically connected to a thin film transistor 120 (refer to FIG. 6) through a first electrode contact hole CNTD. Thus, the first electrode stem portion 210S may receive a predetermined driving voltage from the thin film transistor 120. The thin film transistor 120 to which the first electrode stem portion 210S is electrically connected may be the driving transistor DT shown in FIG. 3.

The second electrode stem portion 220S may be electrically connected to a low-potential auxiliary wiring 161 (refer to FIG. 6) through a second electrode contact hole CNTS. Thus, the second electrode stem portion 220S may receive a low-potential voltage through the low-potential auxiliary wiring 161. Although it is illustrated in FIG. 5 that the second electrode stem portion 220S may be electrically connected to the low-potential auxiliary wiring 161 through the second electrode contact hole CNTS in each of the first sub-pixel PX1, second sub-pixel PX2, and third sub-pixel PX3 of the pixel PX, the disclosure is not limited thereto. For example, the second electrode stem portion 220S may be electrically connected to the low-potential auxiliary wiring 161 through the second electrode contact hole CNTS in any one of the first sub-pixel PX1, second sub-pixel PX2, and third sub-pixel PX3 of the pixel PX. As another example, as shown in FIG. 4, the second electrode stem portion 220S may be electrically connected to the low-potential voltage line VSSL of the non-display area NDA and may not be electrically connected to the low-potential auxiliary wiring 161 through the second electrode contact hole CNTS. For example, the second electrode contact hole CNTS may be omitted.

The first electrode stem portion 210S of any one sub pixel may be disposed parallel to the first electrode stem portion 210S of a sub pixel adjacent thereto in the first direction (X-direction) in the first direction (X-direction). For example, the first electrode stem portion 210S of the first sub-pixel PX1 may be disposed parallel to the first electrode stem portion 210S of the second sub-pixel PX2 in the first direction (X-direction), the first electrode stem portion 210S of the second sub-pixel PX2 may be parallel to the first electrode stem portion 210S of the third sub-pixel PX3 in the first direction (X-direction), and the first electrode stem portion 210S of the third sub-pixel PX3 may be disposed parallel to the first electrode stem portion 210S of the first sub-pixel PX1 in the first direction (X-direction). This is because the first electrode stem portion 210S is connected into one (or integrally formed into one) and then disconnected (or separated) through a laser process after aligning the light emitting elements 300 during the manufacturing process.

The second electrode branch portions 220B may be disposed between the first electrode branch portions 210B. The first electrode branch portions 210B may be disposed symmetrically with respect to the second electrode branch portion 220B. Although it is illustrated in FIG. 5 that each of the first sub-pixel PX1, second sub-pixel PX2, and third sub-pixel PX3 of the pixel PX includes two first electrode branch portions 220B, the disclosure is not limited thereto. For example, each of the first sub-pixel PX1, second sub-pixel PX2 and third sub-pixel PX3 of the pixel PX may include three or more first electrode branch portions 220B.

Further, although it is illustrated in FIG. 5 that each of the first sub-pixel PX1, second sub-pixel PX2, and third sub-pixel PX3 of the pixel PX includes a second electrode branch portions 220B, the disclosure is not limited thereto. For example, in case that each of the first sub-pixel PX1, second sub-pixel PX2, and third sub-pixel PX3 of the pixel PX includes multiple second electrode branch portions 220B, the first electrode branch portions 210B may be disposed between the second electrode branch portions 220B. For example, in each of the first sub-pixel PX1, second sub-pixel PX2 and third sub-pixel PX3 of the pixel P, the first electrode branch portion 210B, the second electrode branch portion 220B, the first electrode branch portion 210B, and the second electrode branch portion 220B may be arranged in the first direction (X-direction) in the stated order.

Multiple light emitting elements 300 may be arranged between the first electrode branch portion 210B and the second electrode branch portion 220B. An end of at least one of the light emitting elements 300 may be disposed to overlap the first electrode branch portion 210B, and another end thereof may be disposed to overlap the second electrode branch portion 220B. The second conductive semiconductor, which is a p-type semiconductor layer, may be disposed at an end of at least one of the light emitting elements 300, and the first conductive semiconductor, which is an n-type semiconductor layer, may be disposed at another end thereof. However, the disclosure is not limited thereto. For example, the first conductive semiconductor, which is an n-type semiconductor layer, may be disposed at an end of at least one of the light emitting elements 300, and the second conductive semiconductor, which is a p-type semiconductor layer, may be disposed at another end thereof.

The light emitting elements 300 may be aligned substantially parallel to each other in the first direction (X-direction). The light emitting elements 300 may be spaced apart in the second direction (Y-direction). The intervals between the light emitting elements 300 may not be uniform. For example, some of the light emitting elements 300 may be adjacent to each other to form a group, and others thereof may be adjacent to each other to form another group. All of the light emitting elements 300 may have non-uniform density.

The connection electrode(s) 260 may be disposed on the first electrode branch portion 210B and the second electrode branch portion 220B, respectively. The connection electrode 260 may extend in the second direction (Y-direction) and may be spaced apart from each other in the first direction (X-direction). The connection electrode 260 may be electrically connected to an end of at least one of the light emitting elements 300. The connection electrode 260 may be electrically connected to the first electrode 210 or the second electrode 220.

The connection electrode 260 may include a first connection electrode 261 disposed on the first electrode branch portion 210B and electrically connected to an end of at least one of the light emitting elements 300, and a second connection electrode 262 disposed on the second electrode branch portion 220B and electrically connected to an end of at least one of the light emitting elements 300. Thus, the first connection electrode 261 may electrically connect the light emitting elements 300 to the first electrode 210, and the second connection electrode 262 may electrically connect the light emitting elements 300 to the second electrode 220.

The width of the first connection electrode 261 in the first direction (X-direction) may be wider than that of the first electrode branch portion 210B in the first direction (X-direction). Further, the width of the second connection electrode 262 in the first direction (X-direction) may be wider than that of the second electrode branch portion 220B in the first direction (X-direction).

Figure 6:
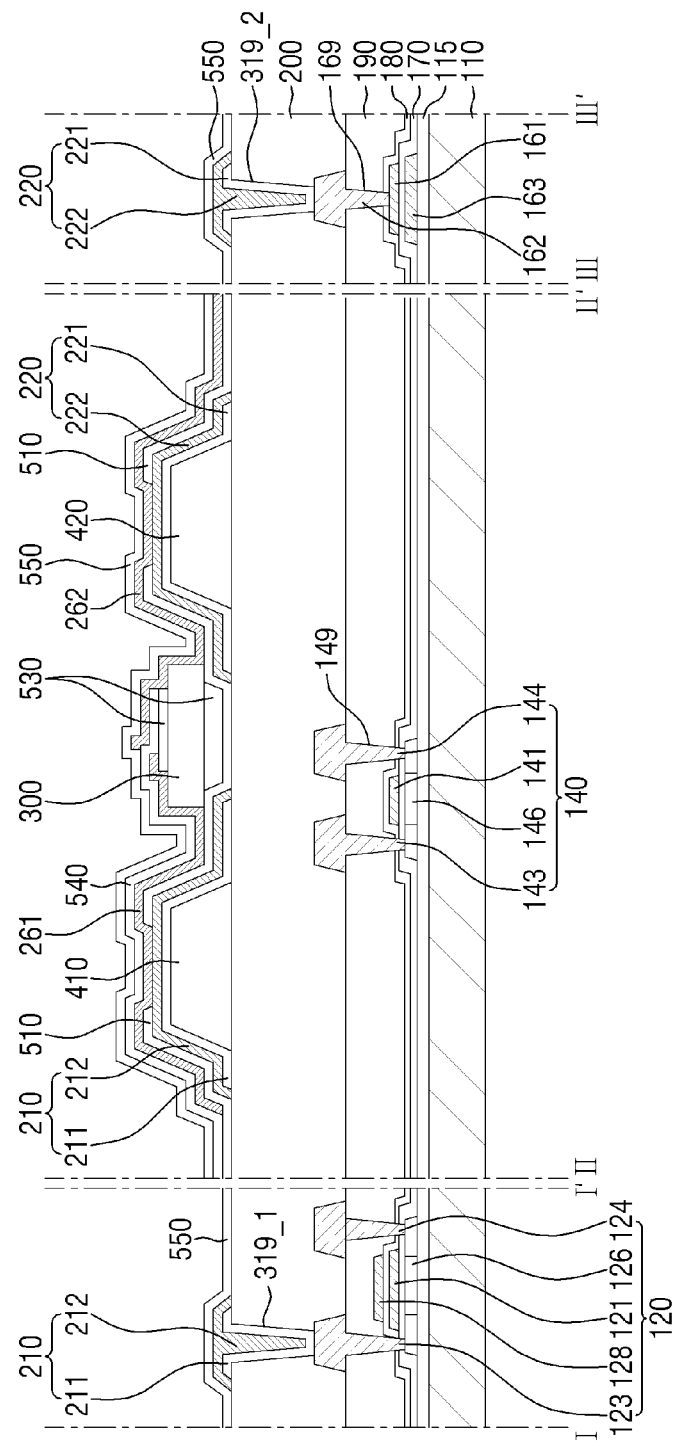
FIG. 6 is a schematic cross-sectional view taken along lines I-I', II-II', and III-III' of FIG. 5.

FIG. 6 is a schematic cross-sectional view taken along lines I-I', II-II', and III-III' of FIG. 5.

The display panel 10 may include a substrate 110, at least one thin film transistor disposed on the substrate 110, electrodes 210 and 220 disposed on the thin film transistor, and a light emitting element 300 disposed on the thin film transistor. The at least one thin film transistor may include a first thin film transistor 120 and a second thin film transistor 140. The first thin film transistor 120 may be the driving transistor DT shown in FIG. 3, and the second thin film transistor 140 may be the scan transistor ST shown in FIG. 3.

Each of the first thin film transistor 120 and the second thin film transistor 140 may include an active layer, a gate electrode, a source electrode, and a drain electrode. The first electrode 210 may be electrically connected to the drain electrode of the first thin film transistor 120. Although it is shown in the drawings that the first electrode 210 is directly connected to the first thin film transistor 120, the disclosure is not limited thereto. For example, the first electrode 210 and the first thin film transistor 120 may be electrically connected to each other through any conductive layer.

The substrate 110 may be an insulating substrate. The substrate 110 may be made of an insulating material such as glass, quartz, or a polymer resin. Examples of the polymer resin may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations thereof. The substrate 110 may be a rigid substrate or may be a flexible substrate capable of bending, folding, rolling, etc.

A buffer layer 115 may be disposed on the substrate 110. The buffer layer 115 may prevent the diffusion of impurity ions or the penetration of moisture or external air and may perform a surface planarization function. The buffer layer 115 may include silicon nitride, silicon oxide, or silicon oxynitride.

A semiconductor layer may be disposed on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, monocrystalline silicon, an oxide semiconductor, or the like.

A first gate insulating layer 170 may be disposed on the semiconductor layer. The first gate insulating layer 170 covers or overlaps the semiconductor layer. The first gate insulating layer 170 may function as a gate insulating film of the thin film transistor. The first gate insulating layer 170 may include silicon oxide, silicon nitride, silicon oxynitride, aluminum oxide, tantalum oxide, hafnium oxide, zirconium oxide, titanium oxide, or the like. These compounds may be used alone or in combination with each other.

A first conductive layer may be disposed on the first gate insulating layer 170. The first conductive layer may include a first gate electrode of the first active layer 126 of the first thin film transistor 120, a second gate electrode disposed on the second active layer 146 of the second thin film transistor 140, and a low-potential auxiliary wiring 161 disposed on the auxiliary layer 163, with the first gate insulating layer 170 therebetween. The first conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single-layer film or a multilayer film.

A second gate insulating layer 180 may be disposed on the first conductive layer. The second gate insulating layer 180 may be an interlayer insulating film. The second gate insulating layer 180 may include an inorganic insulating material such as silicon oxide, silicon nitride, silicon oxynitride, hafnium oxide, aluminum oxide, titanium oxide, tantalum oxide, or zinc oxide.

A second conductive layer may be disposed on the second gate insulating layer 180. The second conductive layer includes a capacitor electrode 128 disposed on the first gate electrode 121 with the second gate insulating layer 180 therebetween. The capacitor electrode 128 may form (or constitute) a storage capacitor together with the first gate electrode 121.

Similar to the first conductive layer, the second conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

An interlayer insulating layer 190 may be disposed on the second conductive layer. The interlayer insulating layer 190 may be an interlayer insulating film. The interlayer insulating layer 190 may perform a surface planarization function. The interlayer insulating layer 190 may include an organic insulating material such as polyacrylate resin, epoxy resin, phenolic resin, polyamide resin, polyimide rein, unsaturated polyester resin, polyphenyleneether resin, polyphenylenesulfide resin, or benzocyclobutene (BCB).

A third conductive layer is disposed on the interlayer insulating layer 190. The third conductive layer includes a first drain electrode 123 and first source electrode 124 of the first thin film transistor 120, a second drain electrode 143 and second source electrode 144 of the second thin film transistor 140, and a power supply electrode 162 disposed on the low-potential auxiliary wiring 161.

Each of the first source electrode 124 and the first drain electrode 123 may be electrically connected to the first active layer 126 through a first contact hole 129 penetrating the interlayer insulating layer 190 and the second gate insulating layer 180. Each of the second source electrode 144 and the second drain electrode 143 may be electrically connected to the second active layer 146 through a second contact hole 149 penetrating the interlayer insulating layer 190 and the second gate insulating layer 180. The power supply electrode 162 may be electrically connected to the low-potential auxiliary wiring 161 through a third contact hole 169 penetrating the interlayer insulating layer 190 and the second gate insulating layer 180.

The third conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer may be a single-layer film or a multilayer film. For example, the third conductive layer may have a laminate structure of Ti/Al/Ti, Mo/Al/Mo, Mo/AlGe/Mo, or Ti/Cu.

An insulating substrate layer 200 may be disposed on the third conductive layer. The insulating substrate layer 200 may include an organic insulating material such as polyacrylate resin, epoxy resin, phenolic resin, polyamide resin, polyimide rein, unsaturated polyester resin, polyphenyleneether resin, polyphenylenesulfide resin, or benzocyclobutene (BCB). The surface of the insulating substrate layer 200 may be flat.

Partition walls 410 and 420 may be disposed on the insulating substrate layer 200. The partition walls 410 and 420 are disposed to be spaced apart from each other and face each other in each of the pixels PX. The first electrode 210 and the second electrode 220 may be disposed on the partition walls 410 and 420 spaced apart from each other, for example, a first partition wall 410 and a second partition wall 420. FIG. 6 shows a case where two first partition walls 410 and a second partition wall 420 are disposed in a sub-pixel, and the first electrode 210 and the second electrode 220 are disposed to overlap these partition walls 410 and 420. FIG. 6 shows only a schematic cross-sectional view of an arrangement of a first partition wall 410 and a second partition wall 420. Other first partition walls 410 may have similar arrangements not shown in FIG. 6.

The embodiments are not limited to particular numbers of the partition walls 410 and 420. For example, a larger number of partition walls 410 and 420 and thus a larger number of first and second electrodes 210 and 220 may be disposed in a single pixel PX. The partition walls 410 and 420 may include at least one first partition wall 410 on which the first electrode 210 is disposed, and at least one second partition wall 420 on which the second electrode 220 is disposed. In this case, the first partition wall 410 and the second partition wall 420 may be spaced apart from each other and face each other, and the partition walls may be alternately arranged in a direction. In some embodiments, two first partition walls 410 may be spaced apart from each other, and a second partition wall 420 may be disposed between the spaced first partition walls 410.

Although not shown in FIG. 6, as described above, the first electrode 210 and the second electrode 220 may include electrode stem portions 210S and 220S and electrode branch portions 210B and 220B, respectively. For example, the first electrode branch portion 210B and the second electrode branch portion 220B may be disposed on the first partition wall 410 and second partition wall 420 of FIG. 6, respectively.

The partition walls 410 and 420 may be made of substantially the same material, and thus may be formed in a process. In this case, the partition walls 410 and 420 may form a lattice pattern. The partition walls 410 and 420 may include polyimide (PI).

Although not shown in the drawings, at least some of the partition walls 410 and 420 may be disposed at the boundary between the respective pixels PX to distinguish them from each other. In this case, the electrodes 210 and 220 may not be disposed on the partition walls 410 and 420 disposed at the boundary between the pixels PX. These partition walls may be arranged in a substantially lattice pattern together with the first partition wall 410 and second partition wall 420 described above. At least some of the partition walls 410 and 420 disposed at the boundary between the respective pixels PX may be disposed to cover or overlap the electrode lines of the display panel 10. However, the disclosure is not limited thereto, and partition walls other than the first partition wall 410 and second partition wall 420 on which the electrodes 210 and 220 are respectively disposed may be disposed by performing an additional process after forming the electrodes 210 and 220.

At least some of the partition walls 410 and 420 may have a structure protruding from the insulating substrate layer 200. The partition walls 410 and 420 may protrude upward from the plane or layer on which the light emitting elements are arranged, and at least some of the protruding portions may include an inclined portion. The partition walls 410 and 420 having a protruding structure with an inclined portion may reflect the light incident on reflective layers 211 and 221 disposed on the partition walls 410 and 420. The light directed from the light emitting elements 300 toward the reflective layers 211 and 221 may be reflected and then transmitted to the outside of the display panel 10, for example, above the partition walls 410 and 420. The shape of each of the partition walls 410 and 420 having the protruding structure is not particularly limited. Although FIG. 6 shows the partition walls 410 and 420 each having a shape in which a side surface is inclined, an upper surface is flat, and thus an edge is angled, the disclosure is not limited thereto. Each of the partition walls 410 and 420 may have a curved protruding structure.

The reflective layers 211 and 221 may be disposed on the partition walls 410 and 420.

The first reflective layer 211 overlaps the first partition wall 410, and a part of the first reflective layer 211 is electrically connected to the first drain electrode 123 of the first thin film transistor 120 through a fourth contact hole 319_1 penetrating the insulating substrate layer 200. The second reflective layer 221 overlaps the second partition wall 420, and a part of the second reflective layer 221 is electrically connected to the power supply electrode 162 through a fifth contact hole 319_2 penetrating the insulating substrate layer 200.

The first reflective layer 211 may be electrically connected to the first drain electrode 123 of the first thin film transistor 120 through the fourth contact hole 319_1 in the pixel PX. Therefore, the first thin film transistor 120 may be disposed in a region overlapping the pixel PX. It is shown in FIGS. 5 and 6 that the first reflective layer 211 is electrically connected to the first thin film transistor 120 through the first electrode contact hole CNTD disposed on the first electrode stem portion 210S. For example, the first electrode contact hole CNTD may be the fourth contact hole 319_1.

The second reflective layer 221 may also be electrically connected to the power supply electrode 162 through the fifth contact hole 319_2 in the pixel PX. It is shown in FIG. 6 that the second reflective layer 221 is electrically connected to the power supply electrode 162 through the fifth contact hole 319_2 in one pixel PX. It is shown in FIG. 5 that the second electrode 220 of each pixel PX is electrically connected to the low-potential auxiliary wiring 161 through the second electrode contact holes CNTS on the second electrode stem portion 220S. For example, the second electrode contact hole CNTD may be the fifth contact hole 319_2.

As described above, in FIG. 5, the first electrode contact hole CNTD and the second electrode contact hole CNTS are disposed on the first electrode stem portion 210S and the second electrode stem portion 220S, respectively. Thus, it is shown in FIG. 6 that, in the cross-sectional view of the display panel 10, the first electrode 210 and the second electrode 220 are electrically connected to the first thin film transistor 120 or the low-potential auxiliary wiring 161 through the fourth contact hole 319_1 and the fifth contact hole 319_2 in a region spaced apart from the partition walls 410 and 420 where the first electrode branch portion 210B and the second electrode branch portion 220B are disposed.

However, the disclosure is not limited thereto. For example, in FIG. 5, the second electrode contact hole CNTS may be disposed at various positions even on the second electrode stem portion 220S, and in some cases, the second electrode contact hole CNTS may be disposed on the second electrode branch portion 220B. Further, in some embodiments, the second reflective layer 221 may be connected to a second electrode contact hole CNTS or a fifth contact hole 319_2 in FIG. 6 in a region outside the pixel PX. As described above, the second electrodes 220 of each pixel PX may be electrically connected to each other through the second electrode stem portion 220S, and thus may receive the same electric signal.

In some embodiments, in the second electrode 220, the second electrode stem portion 220S may be electrically connected to the power supply electrode 162 through a single second electrode contact hole CNTS in the non-display area of the display panel 10. Unlike the display panel 10 of FIG. 5, even in case that the second electrode stem portion 220S is electrically connected to the power supply electrode 162 through a single contact hole, the second electrode stem portion 220S extend to the adjacent pixel PX and is electrically connected, so that the same electric signal may be applied to the second electrode branch portion 220B of each pixel PX. In the case of the second electrode 220 of the display panel 10, the position of the contact hole for receiving an electric signal from the power supply electrode 162 may vary according to the structure of the display panel 10.

Referring to FIGS. 5 and 6, each of the reflective layers 211 and 221 may include a high-reflectance material to reflect the light emitted from the light emitting element 300. For example, each of the reflective layers 211 and 221 may include a material such as silver (Ag) or copper (Cu), but the disclosure is not limited thereto.

A first electrode layer 212 and a second electrode layer 222 may be disposed on the first reflective layer 211 and the second reflective layer 221, respectively.

The first electrode layer 212 is disposed directly on the first reflective layer 211. The first electrode layer 212 and the first reflective layer 211 may have substantially the same pattern. The second electrode layer 222 is disposed directly on the second reflective layer 221 and spaced apart from the first electrode layer 212. The second electrode layer 222 and the second reflective layer 221 may have substantially the same pattern.

In an embodiment, the electrode layers 212 and 222 may overlap the underlying reflective layers 211 and 221, respectively. For example, the electrode layers 212 and 222 may be formed to be larger than the reflection layers 211 and 221 to overlap the side surfaces of the electrode layers 212 and 222. However, the disclosure is not limited thereto.

The first electrode layer 212 and the second electrode layer 222 may transmit the electric signals transmitted to the first reflective layer 211 and second reflective layer 221 electrically connected to the first thin film transistor 120 or the power supply electrode 162 to the connection electrodes 261 and 262, which will be described below. The electrode layers 212 and 222 may include a transparent conductive material. For example, the electrode layers 212 and 222 may include a material such as indium tin oxide (ITO), indium zinc oxide (IZO), or indium tin-zinc oxide (ITZO), but the disclosure is not limited thereto. In some embodiments, the reflective layers 211 and 221 and the electrode layers 212 and 222 may have a structure in which a transparent conductive layer such as ITO, IZO, or ITZO and a metal layer such as silver or copper are laminated as one or more layers. For example, the reflective layers 211 and 221 and the electrode layers 212 and 222 may have a laminate structure of ITO/silver (Ag)/ITO.

The first reflective layer 211 and the first electrode layer 212, which are disposed on the first partition wall 410, form the first electrode 210. The first electrode 210 may protrude to a region extending from both ends of the first partition wall 410, and thus the first electrode 210 may contact the insulating substrate layer 200 in the protruding region. The second reflective layer 221 and the second electrode layer 222, which are disposed on the second partition wall 420, form the second electrode 220. The second electrode 220 may protrude to a region extending from both ends of the second partition wall 420, and thus the second electrode 220 may contact the insulating substrate layer 200 in the protruding region.

The first electrode 210 and the second electrode 220 may be disposed to overlap the entire region of the first barrier rib 410 and the entire region of the second barrier rib 420, respectively. However, as described above, the first electrode 210 and the second electrode 220 are spaced apart from each other and face each other. As will be described below, a first insulating layer 510 may be disposed between the first electrode 210 and second electrode 220 spaced apart from each other, and the light emitting element 300 may be disposed on the first insulating layer 510.

The first reflective layer 211 may receive a driving voltage from the first thin film transistor 120, and the second reflective layer 221 may receive a power supply voltage from the low-potential auxiliary wiring 161, so that the first electrode 210 and the second electrode 220 receive a driving voltage and a power supply voltage, respectively.

Specifically, the first electrode 210 may be electrically connected to the first thin film transistor 120, and the second electrode 220 may be electrically connected to the low-potential auxiliary wiring 161. Accordingly, the first connection electrode 261 and the second connection electrode 262 disposed on the first electrode 210 and the second electrode 220 may receive the driving voltage and the power supply voltage. The driving voltage and the power supply voltage are transmitted to the light emitting element 300, and a predetermined current flows through the light emitting element 300 to emit light.

A first insulating layer 510 is disposed on the first electrode 210 and the second electrode 220 to partially overlap the first electrode 210 and the second electrode 220. The first insulating layer 510 may overlap most of the upper surfaces of the first electrode 210 and the second electrode 220 and may partially expose the first electrode 210 and the second electrode 220. Further, the first insulating layer 510 may also be disposed in a space between the first electrode 210 and second electrode 220 spaced apart from each other. With reference to FIG. 5, the first insulating layer 510 may be disposed to have an island shape or a linear shape along a space between the first electrode branch 210B and the second electrode branch 220B in a plan view.

It is shown in FIG. 6 that the first insulating layer 510 is disposed in the space between one first electrode 210 (for example, a first electrode branch portion 210B) and a second electrode 220 (for example, a second electrode branch portion 220B). However, as described above, since there may be multiple first electrodes 210 and multiple second electrodes 220, the first insulating layer 510 may also be disposed between a first electrode 210 and another second electrode 220 or between a second electrode 220 and another first electrode 210.

The first insulating layer 510 may overlap a part of a region on each of the electrodes 210 and 220, for example, a part of a region protruding in a direction in which the first electrode 210 and the second electrode 220 face each other. The first insulating layer 510 may be disposed even in a region where the inclined side surfaces and flat upper surfaces of the partition walls 410 and 420 overlap the electrodes 210 and 220. Further, the first insulating layer 510 may be disposed to partially overlap the opposite sides of the first electrode 210 and the second electrode 220 facing each other. The first insulating layer 510 may expose only the center portions of the first electrode 210 and the second electrode 220.

The first insulating layer 510 may be disposed between the light emitting element 300 and the insulating substrate layer 200. The lower surface of the first insulating layer 510 may contact the insulating substrate layer 200, and the light emitting element 300 may be disposed on the upper surface of the first insulating layer 510. Further, the first insulating layer 510 may contact the electrodes 210 and 220 on both sides thereof to electrically insulate them from each other.

For example, the first insulating layer 510 may overlap each end of the first electrode 210 and the second electrode 220, which protrude in a direction in which the first electrode 210 and the second electrode 220 face each other. A part of the lower surface of the first insulating layer 510 may contact the insulating substrate layer 200, and a part of the lower surface of the first insulating layer 510 and a side surface of the first insulating layer may contact each of the electrodes 210 and 220. Accordingly, the first insulating layer 510 may protect regions overlapping the electrodes 210 and 220, and electrically insulate them from each other. Further, the first insulating layer 510 may prevent the first conductive semiconductor 310 and second conductive semiconductor 320 of the light emitting element 300 from directly contacting other substrates and may prevent damage to the light emitting element 300.

However, the disclosure is not limited thereto. In some embodiments, the first insulating layer 510 may be disposed only in a region overlapping the inclined side surfaces of the partition walls 410 and 420 among the regions on the first electrode 210 and the second electrode 220. In this case, the lower surface of the first insulating layer 510 is terminated at the inclined sides of the partition walls 410 and 420, and each of the electrodes 210 and 220 disposed on the inclined side surfaces of the partition walls 410 and 420 may be exposed to contact the connection electrode 260.

The first insulating layer 510 may be disposed such that both ends of the light emitting element 300 are exposed. Accordingly, the connection electrode 260 may contact the exposed upper surface of each of the electrodes 210 and 220 and both ends of the light emitting element 300, and the connection electrode 260 may transmit an electrical signal applied to the first electrode 210 and the second electrode 220 to the light emitting element 300.

The lower surface of the first insulating layer 510 may contact the electrodes 210 and 220 to protect these electrodes 210 and 220 and insulate these electrodes 210 and 220 not to directly contact each other. Further, the upper surface of the first insulating layer 510 may partially contact the light emitting element 300 and may prevent the light emitting element 300 from directly contacting the electrodes 210 and 220.

Figure 7:
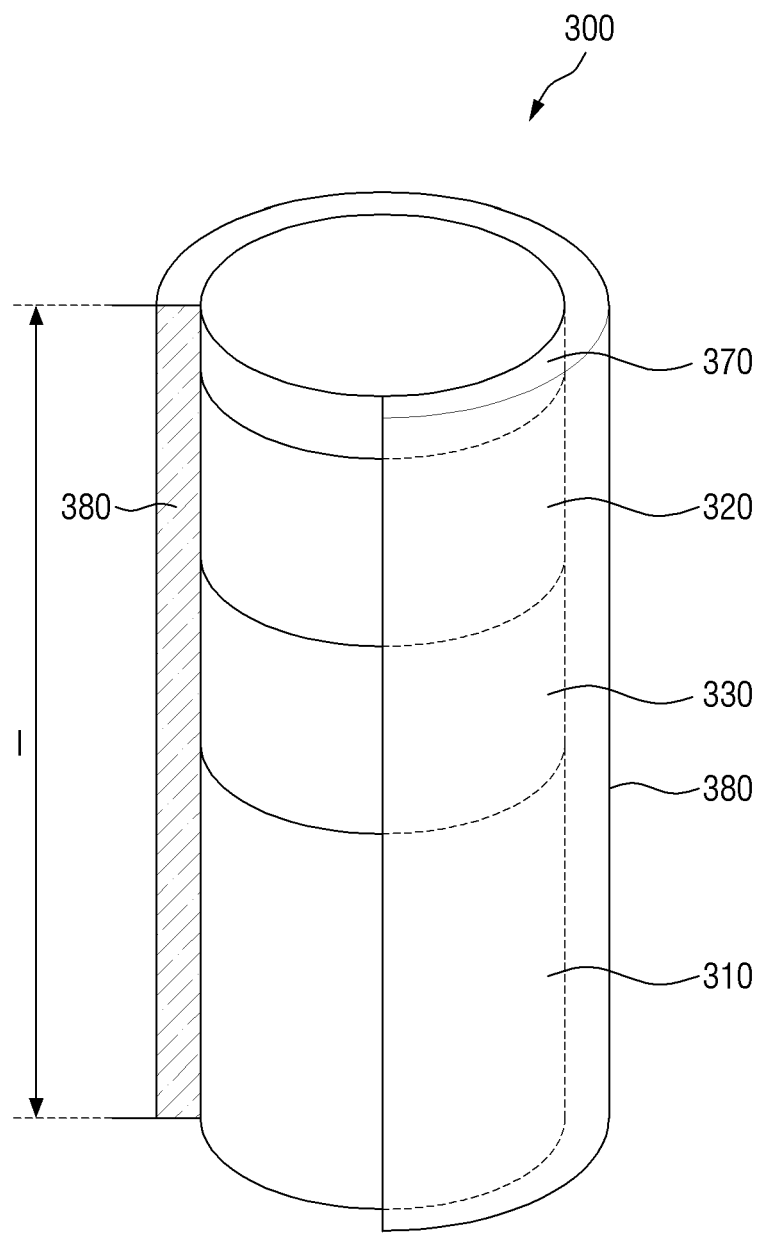
FIG. 7 is a schematic perspective view specifically illustrating the light emitting element of FIG. 6.

FIG. 7 is a schematic perspective view illustrating the light emitting element of FIG. 6.

Referring to FIG. 7, the light emitting element 300 may include conductive semiconductors 310 and 320, an element active layer 330, an electrode material layer 370, and an insulating material film 380. The electric signals received from the first electrode 210 and the second electrode 220 may be transmitted to the element active layer 330 through the conductive semiconductors 310 and 320 to emit light.

The light emitting element 300 may include: a rod-shaped semiconductor core including a first conductive semiconductor 310, a second conductive semiconductor 320, an element active layer 330 disposed between the first conductive semiconductor 310 and the second conductive semiconductor 320, and an electrode material layer 370 disposed on the second conductive semiconductor 320; and an insulating material film 380 disposed to surround the outer peripheral surface of the semiconductor core. Although it is shown in FIG. 7 that the light emitting element 300 has a structure in which the first conductive semiconductor 310, element active layer 330, second conductive semiconductor 320 and electrode material layer 370 of the semiconductor core are sequentially laminated in the length direction, the disclosure is not limited thereto. The electrode material layer 370 may be omitted, and in some embodiments, the electrode material layer 370 may be disposed on at least one of both side surfaces of the first conductive semiconductor 310 and the second conductive semiconductor 320. Hereinafter, the light emitting element 300 of FIG. 7 will be described as an example, but the descriptions below may be applied equally to other structures of the light emitting element 300.

The first conductive semiconductor 310 may be an n-type semiconductor layer. For example, in case that the light emitting element 300 emits light of a blue wavelength band, the first conductive semiconductor 310 may be (or include) a semiconductor material having a formular of $In_xAl_yGa_{1-x-y}N$ ($0 \leq x \leq 1$, $0 \leq y \leq 1$, $0 \leq x+y \leq 1$). For example, the semiconductor material may be at least one of InAlGaN, GaN, AlGaN, InGaN, AlN, and InN, which are doped with an n-type semiconductor. The first conductive semiconductor 310 may be doped with a first conductive dopant, such as Si, Ge, Sn, or the like. The length of the first conductive semiconductor 310 may be in the range of about 1.5 μm to about 5 μm, but the disclosure is not limited thereto.

The second conductive semiconductor 320 may be a p-type semiconductor layer.

For example, when the light emitting element 300 emits light of a blue wavelength band, the second conductive semiconductor 320 may be a semiconductor material having a formula of $In_xAl_yGa_{1-x-y}N(0\leq x\leq 1, 0\leq y\leq 1, 0\leq x+y\leq 1)$. For example, the semiconductor material may be at least one of InAlGaN, GaN, AlGaN, InGaN, AlN, and InN, which are doped with a p-type semiconductor. The second conductive semiconductor 320 may be doped with a second conductive dopant, such as Mg, Zn, Ca, Se, Ba, or the like. The length of the second conductive semiconductor 320 may be in the range of about 0.08 μm to about 0.25 μm, but the disclosure is not limited thereto.

The element active layer 330 may be disposed between the first conductive semiconductor 310 and the second conductive semiconductor 320 and may include a material having a single or multiple quantum well structure. In case that the element active layer 330 includes a material having a multiple quantum well structure, the multiple quantum well structure may be a structure in which quantum layers and well layers are alternately laminated. The element active layer 330 may emit light by the coupling of electron-hole pairs according to an electrical signal applied through the first conductive semiconductor 310 and the second conductive semiconductor 320. For example, in case that the element active layer 330 emits light of a blue wavelength band, it may include a material such as AlGaN or AlInGaN. In case that the element active layer 330 has a multiple quantum well structure in which quantum layers and well layers are alternately laminated, the quantum layer may include a material such as AlGaN or AlInGaN, and the well layer may include a material such as GaN or AlGaN. However, the disclosure is not limited thereto. The element active layer 330 may have a structure in which semiconductor materials having high bandgap energy and semiconductor materials having low bandgap energy are alternately laminated and may include other Group III-V semiconductor materials depending on the wavelength band of the emitted light. Accordingly, the light emitted from the element active layer 330 is not limited to light of a blue wavelength band, and in some cases, the element active layer 330 may emit light of a red wavelength band or light of a green wavelength band. The length of the element active layer 330 may be in the range of about 0.05 μm to about 0.25 μm, but the disclosure is not limited thereto.

The light emitted from the element active layer 330 may be emitted not only onto the outer surface of the light emitting element 300 in the length direction but also onto both side surfaces thereof. For example, the direction of the light emitted from the element active layer 330 is not limited to a single direction.

The electrode material layer 370 may be an ohmic connection electrode. However, the disclosure is not limited thereto. For example, the electrode material layer 370 may be a Schottky connection electrode. The electrode material layer 370 may include a conductive metal. For example, the electrode material layer 370 may include at least one of aluminum (Al), titanium (Ti), indium (In), gold (Au), and silver (Ag). The electrode material layer 370 may include a uniform material and may also include different materials. However, the disclosure is not limited thereto.

The insulating material film 380 is disposed to surround the outer peripheral surface of the semiconductor core. The insulating material film 380 may be formed outside the first conductive semiconductor 310, the second conductive semiconductor 320, the element active layer 330, and the electrode material layer 370, and may protect these members. For example, the insulating material film 380 may surround the side surfaces of the members, and may not be formed at both ends of the light emitting element 300 in the length direction (for example, at both ends thereof at which the first conductive semiconductor 310 and the electrode material layer 370 are disposed). However, the disclosure is not limited thereto.

Although it is shown in FIG. 7 that the insulating material film 380 may extend in the length direction to cover or overlap the first conductive semiconductor 310 and the electrode material layer 370, the disclosure is not limited thereto. The insulating material film 380 may cover only the first conductive semiconductor 310, the element active layer 330, and the second conductive semiconductor 320, or may cover only a part of the electrode material layer 370 to expose a part of the outer surface of the electrode material layer 370.

The length of the insulating material film 380 may be in the range of about 0.5 μm to about 1.5 μm, but the disclosure is not limited thereto.

The insulating material film 380 may protect the first conductive semiconductor 310, the second conductive semiconductor 320, the element active layer 330, and the electrode material layer 370. The insulating material film 380 may include a material having insulating properties such as silicon oxide ($SiO_x$), silicon nitride ($SiN_x$), silicon oxynitride ($SiO_xN_y$), aluminum nitride (AlN), or aluminum oxide ($Al_2O_3$). Accordingly, it is possible to prevent an electrical short circuit that may occur in case that the element active layer 330 directly contacts the first electrode 210 or the second electrode 220. Further, since the insulating material film 380 includes the element active layer 330 and protects the outer peripheral surface of the light emitting element 300, it is possible to prevent a decrease in luminous efficiency.

FIG. 8 is a flowchart illustrating a method of manufacturing a display device according to an embodiment. FIGS. 9A to 9G are schematic plan views of pixels in the display area illustrating a method of manufacturing a display device according to an embodiment. FIGS. 10A to 10G are schematic cross-sectional views taken along line II-II' of FIGS. 9A to 9G explaining a method of manufacturing a display device according to an embodiment.

Hereinafter, a method of manufacturing a display device according to an embodiment will be described in detail with reference to FIGS. 8, 9A to 9G, and 10A to 10G.

In FIGS. 10A to 10G, for convenience of explanation, only the upper portion of the insulating substrate layer 200 is illustrated. For example, in FIGS. 10A to 10G, the thin film transistors 120 and 140, the low-potential auxiliary wiring 161, and the auxiliary layer 163 will not be illustrated.

Figure 9A:
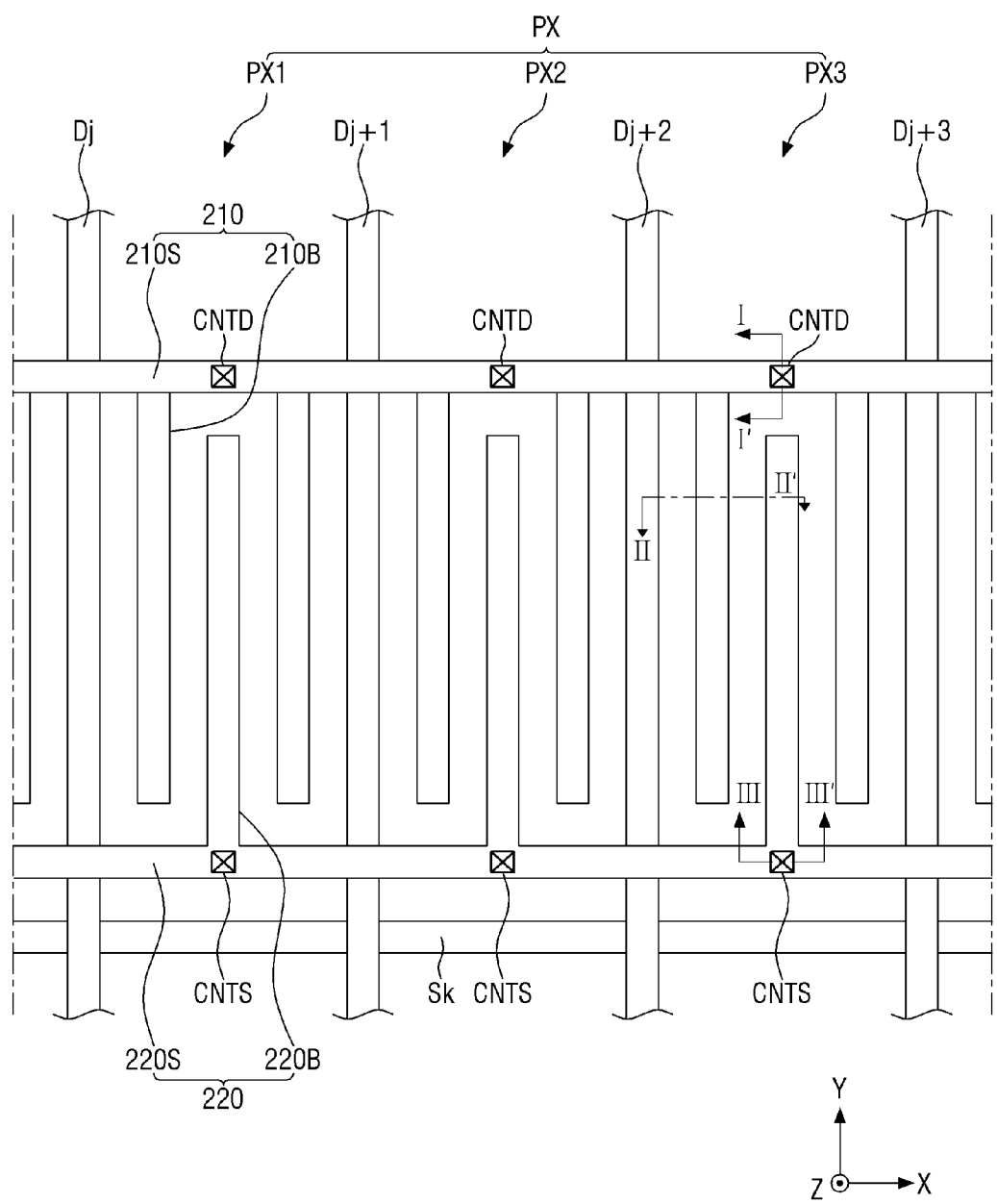
FIGS. 9A to 9G are schematic plan views of pixels illustrating a method of manufacturing a display device according to an embodiment.
Figure 10A:
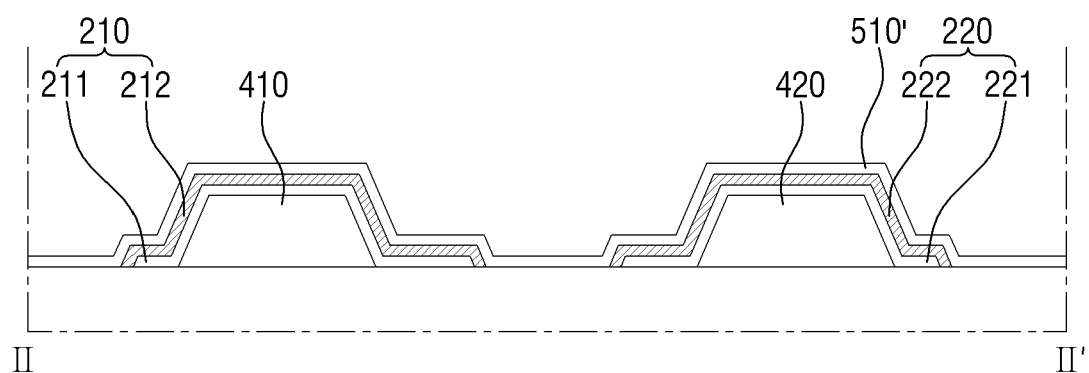
FIGS. 10A to 10G are schematic cross-sectional views taken along line II-II' of FIGS. 9A to 9G illustrating a method of manufacturing a display device according to an embodiment.

First, referring to FIGS. 9A and 10A, a first partition wall 410 and a second partition wall 420 are formed on an insulating substrate layer 200, first electrodes 210 and second electrodes 220 are formed on the first partition wall 410 and the second partition wall 420, and a first insulating material layer 510' is formed on the first electrodes 210 and the second electrodes 220 (refer to S101 of FIG. 8).

The first partition wall 410 and the second partition wall 420 are formed on the insulating substrate layer 200. The first partition wall 410 and the second partition wall 420 may be spaced apart from each other. The first partition wall 410 and the second partition wall 420 may be formed of an organic material such as polyimide (PI). The first partition wall 410 and the second partition wall 420 may be formed by patterning an organic material by a mask process.

Then, the first electrodes 210 are formed on the first partition wall 410, and the second electrodes 220 are formed on the second partition wall 420. Each of the first electrodes 210 may include a first reflective layer 211 and a first electrode layer 212. Each of the second electrodes 220 may include a second reflective layer 221 and a second electrode layer 222. Each of the first reflective layer 211 and the second reflective layer 221 may include a material such as silver (Ag) or copper (Cu). Each of the first electrode layer 212 and the second electrode layer 222 may be a transparent conductive layer including ITO, IZO, or ITZO. The first reflective layer 211, the second reflective layer 221, the first electrode layer 212, and the second electrode layer 222 may be formed by patterning a metal layer by a mask process.

In this case, the first electrodes 210 may extend in the first direction (X-direction) without being disconnected (or separated). Therefore, the first electrode 210 of the first sub-pixel PX1 may be electrically connected to the first electrode 210 of the second sub-pixel PX2 adjacent thereto, the first electrode 210 of the second sub-pixel PX2 may be electrically connected to the first electrode 210 of the third sub-pixel PX3 adjacent thereto, and the first electrode 210 of the third sub-pixel PX3 may be electrically connected to the first electrode 210 of the first sub-pixel PX1 adjacent thereto. Thus, as shown in FIG. 4, the first electrodes 210 may be electrically connected to the first floating line FL1 and second floating line FL2 of the non-display area NDA. Accordingly, in a process of aligning the light emitting elements 300, which will be described below, the first electrodes 210 may receive a ground voltage through the first floating line FL1 and second floating line FL2 of the non-display area NDA.

Next, the first insulating material layer 510' is formed to overlap the first electrodes 210 and the second electrodes 220. The first insulating material layer 510' may be formed of an inorganic layer, for example, a silicon nitride layer, a silicon oxynitride layer, a silicon oxide layer, a titanium oxide layer, or an aluminum oxide layer. The first insulating material layer 510' may be formed into a first insulating layer 510 by aligning the light emitting elements 300 and then patterning the first insulating material layer 510' in a process to be described below.

Figure 9B:
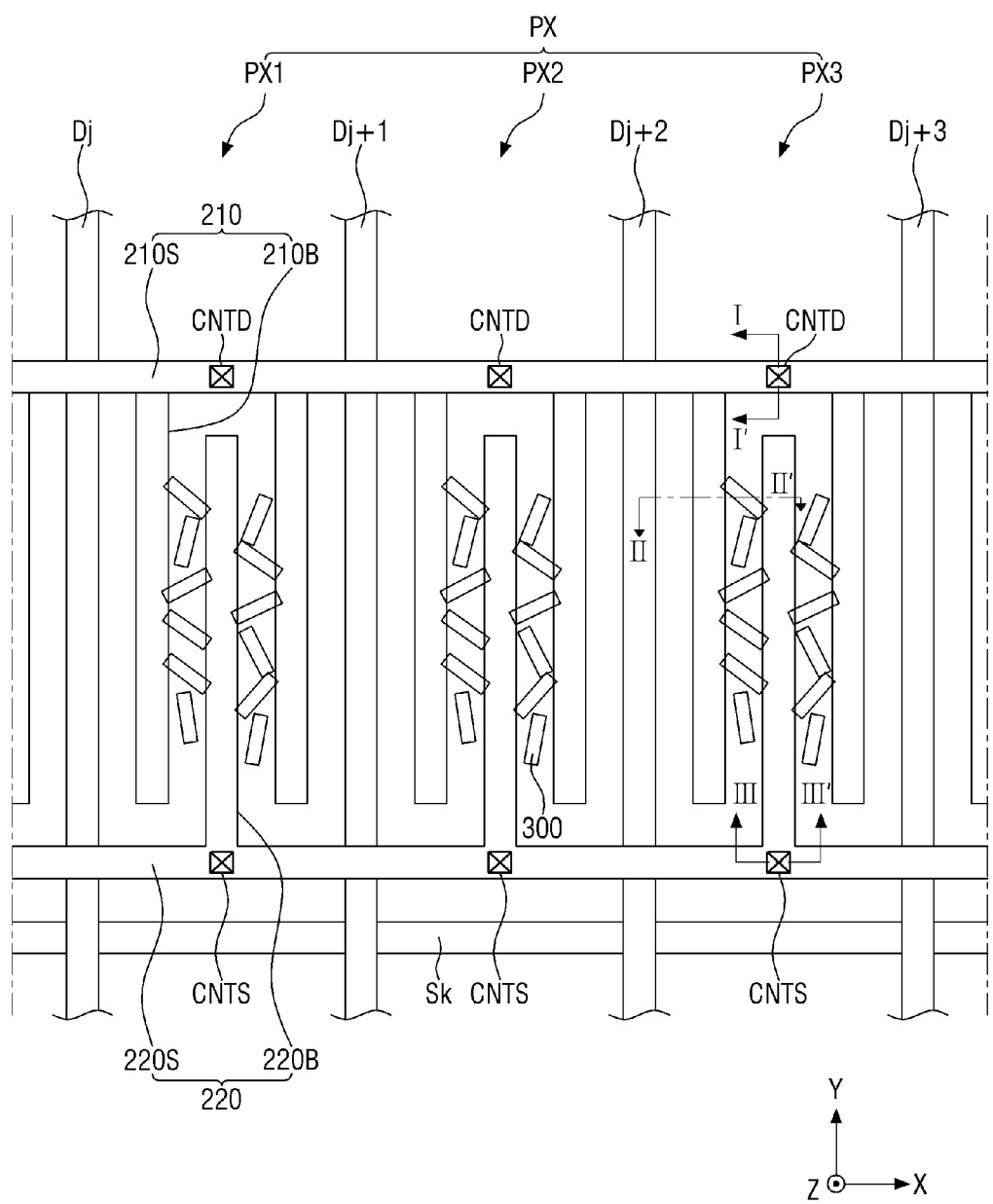
Figure 10B:
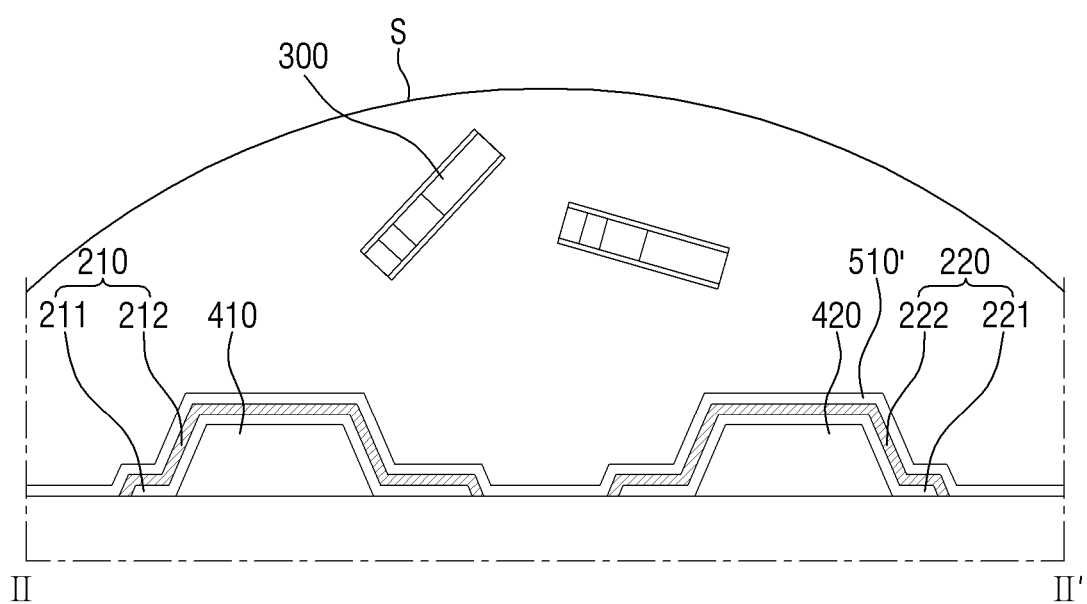

Second, referring to FIGS. 9B and 10B, a coating solution S containing the light emitting elements 300 is applied onto the first insulating material layer 510' in the first sub-pixel PX1, second sub-pixel PX2 and third sub-pixels PX3 of each of the pixels PX (step S102 of FIG. 8).

As shown in FIGS. 9B and 10B, the light emitting elements 300 may be irregularly and randomly arranged in the coating solution S.

The applying of the coating solution S may be carried out using various processes such as inkjet printing, inkjet injection, slot dye coating, and slot dye printing. However, the disclosure is not limited thereto.

Figure 9C:
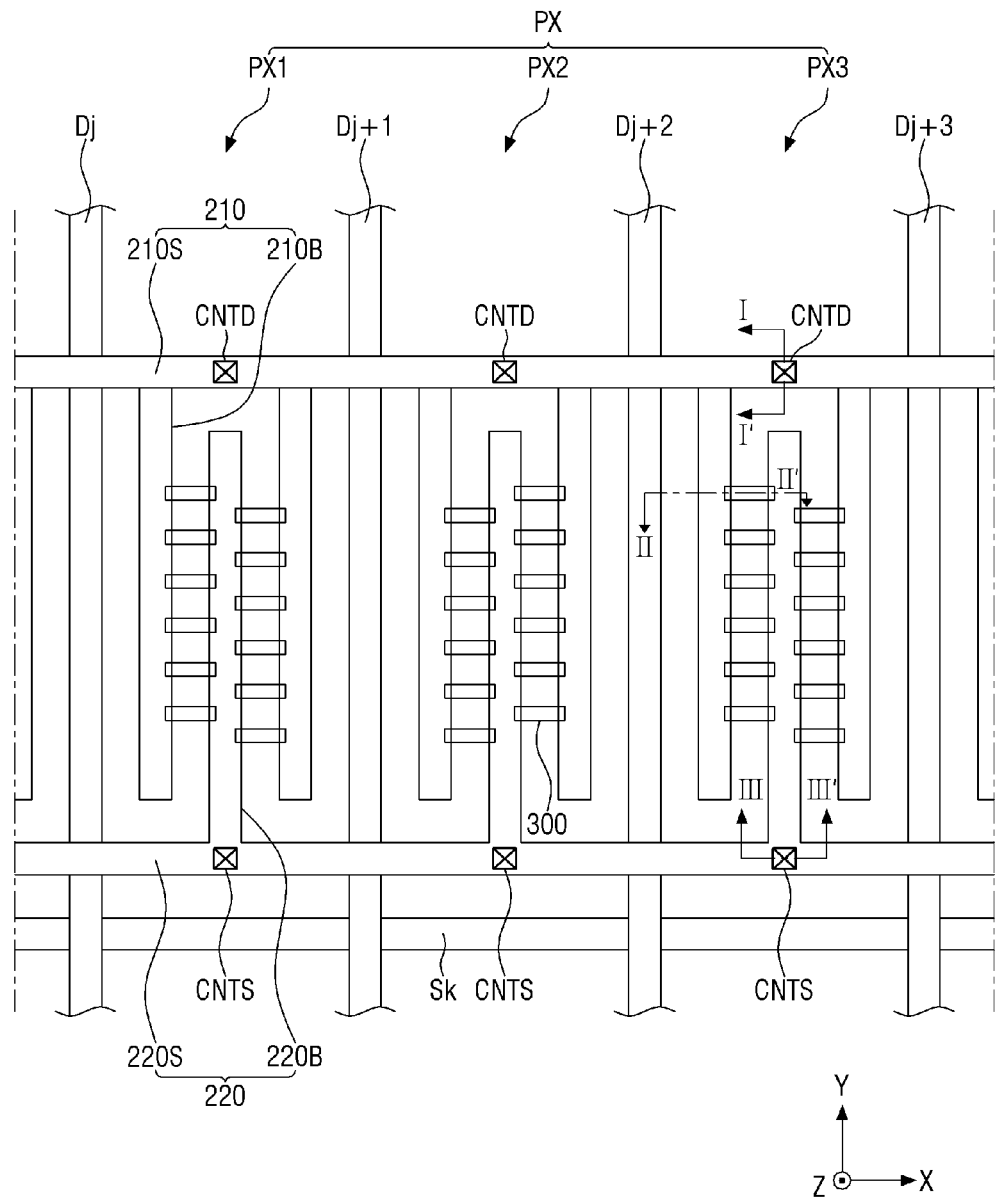
Figure 10C:
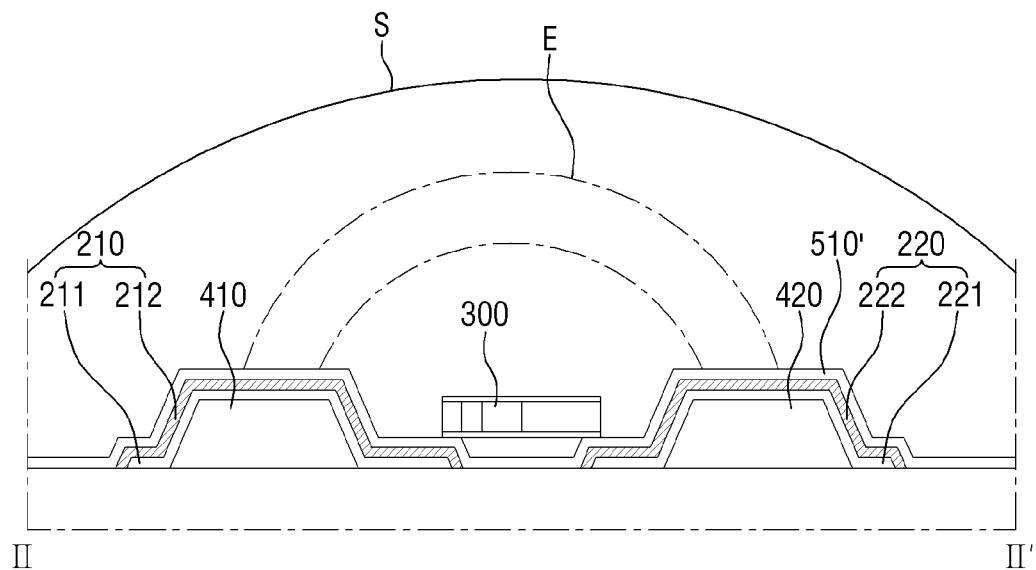

Third, referring to FIGS. 9C and 10C, an electric field E is formed between the first electrode 210 and second electrode 220 adjacent to each other to align the light emitting elements 300 (step S103 of FIG. 8).

Since the first electrode 210 is electrically connected to the first floating line FL1 and the second floating line FL2 without being disconnected, the first electrode 210 may receive a ground voltage through the first floating line FL1 and the second floating line FL2. Since the second electrode 220 is electrically connected to the low-potential voltage line VSSL as shown in FIG. 4, the second electrode 220 may receive an AC voltage through the low-potential voltage line VSSL. In case that a ground voltage is applied to the first electrode 210 and an AC voltage is applied to the second electrode 220, an electric field E is formed between the first electrode 210 and the second electrode 220. In this case, the light emitting elements 300 may receive a dielectrophoretic force by the electric field E and may be aligned in the first direction (X-direction) between the first electrode 210 and the second electrode 220 as shown in FIG. 10C. Details of the method of aligning the light emitting elements 300 will be described below with reference to FIG. 13.

An electric field E is formed between the first electrode 210 and second electrode 220 adjacent to each other to align the light emitting elements 300, and then the coating solution S containing the light emitting elements 300 may be dried. At the time of drying the coating solution S, when solution molecules of the coating solution S are volatilized first in an arbitrary region without being uniformly volatilized over the entire region, a hydrodynamic force may be generated in the coating solution S. In this case, the positions of the light emitting elements 300 may be moved by the hydrodynamic force. Therefore, it is preferable that the process of drying the coating solution S is performed while the alignment of the light emitting elements 300 is maintained.

Figure 9D:
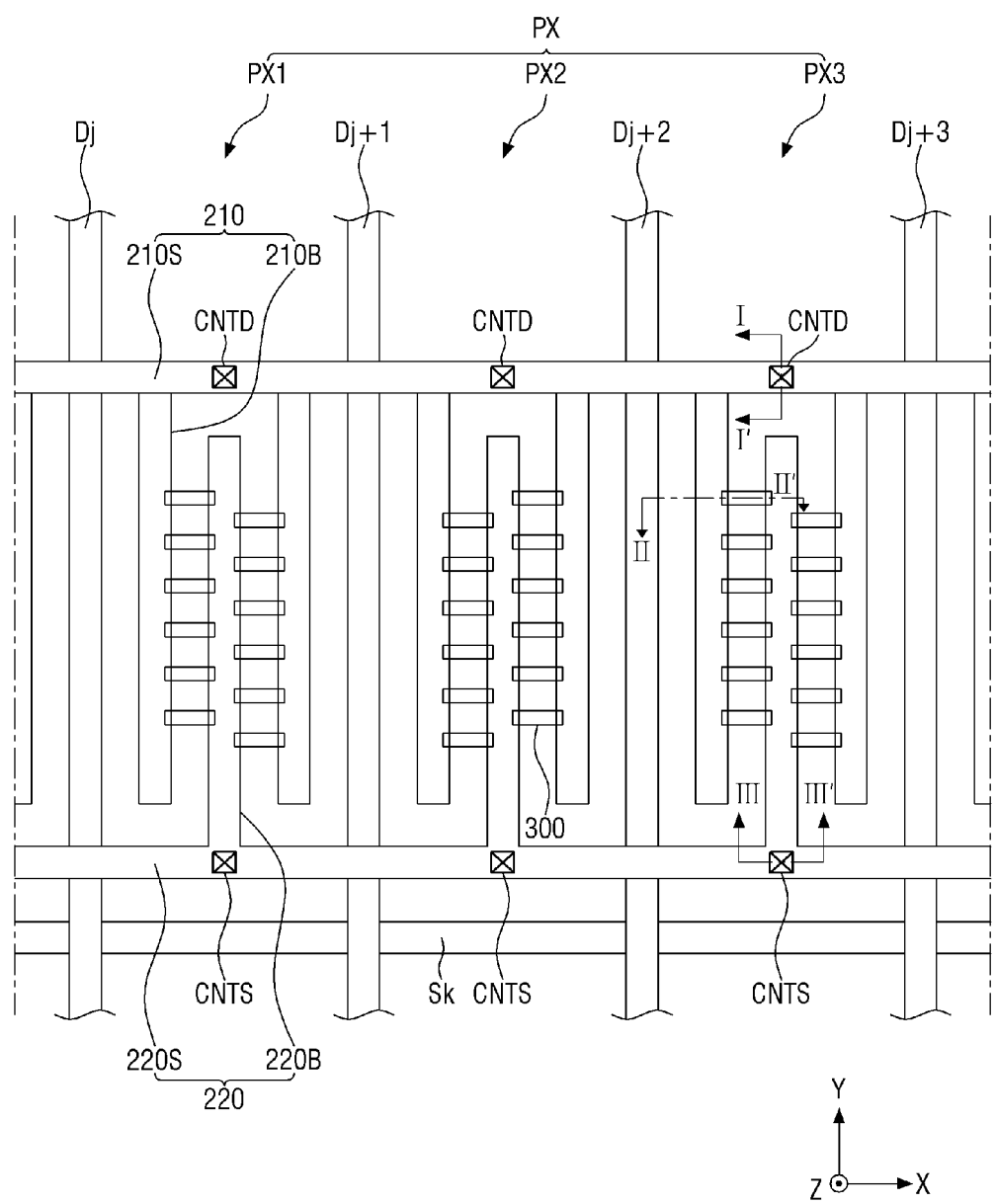
Figure 10D:
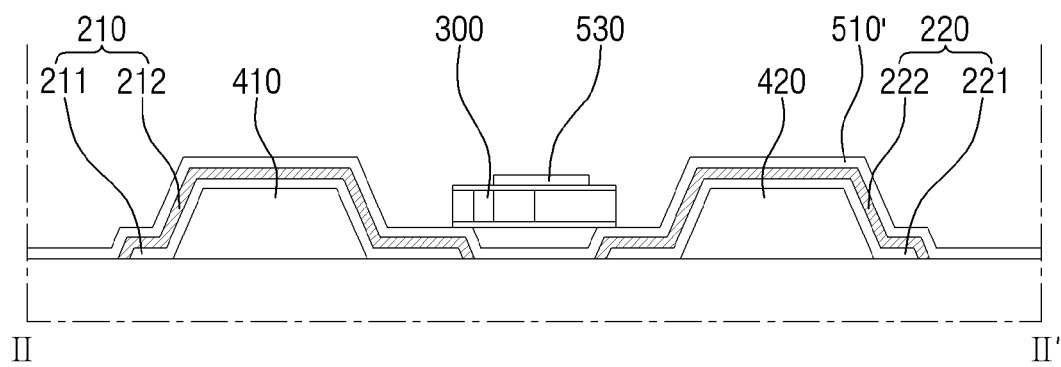

Fourth, referring to FIGS. 9D and 10D, the light emitting elements 300 are aligned between the first electrode 210 and the second electrode 220, and then the coating solution S is volatilized and removed. (step S104 of FIG. 8).

Then, a second insulating layer 530 may be formed on the light emitting elements 300. The second insulating layer 530 may be formed of or include an inorganic layer, for example, a silicon nitride layer, a silicon oxynitride layer, a silicon oxide layer, a titanium oxide layer, or an aluminum oxide layer.

Figure 9E:
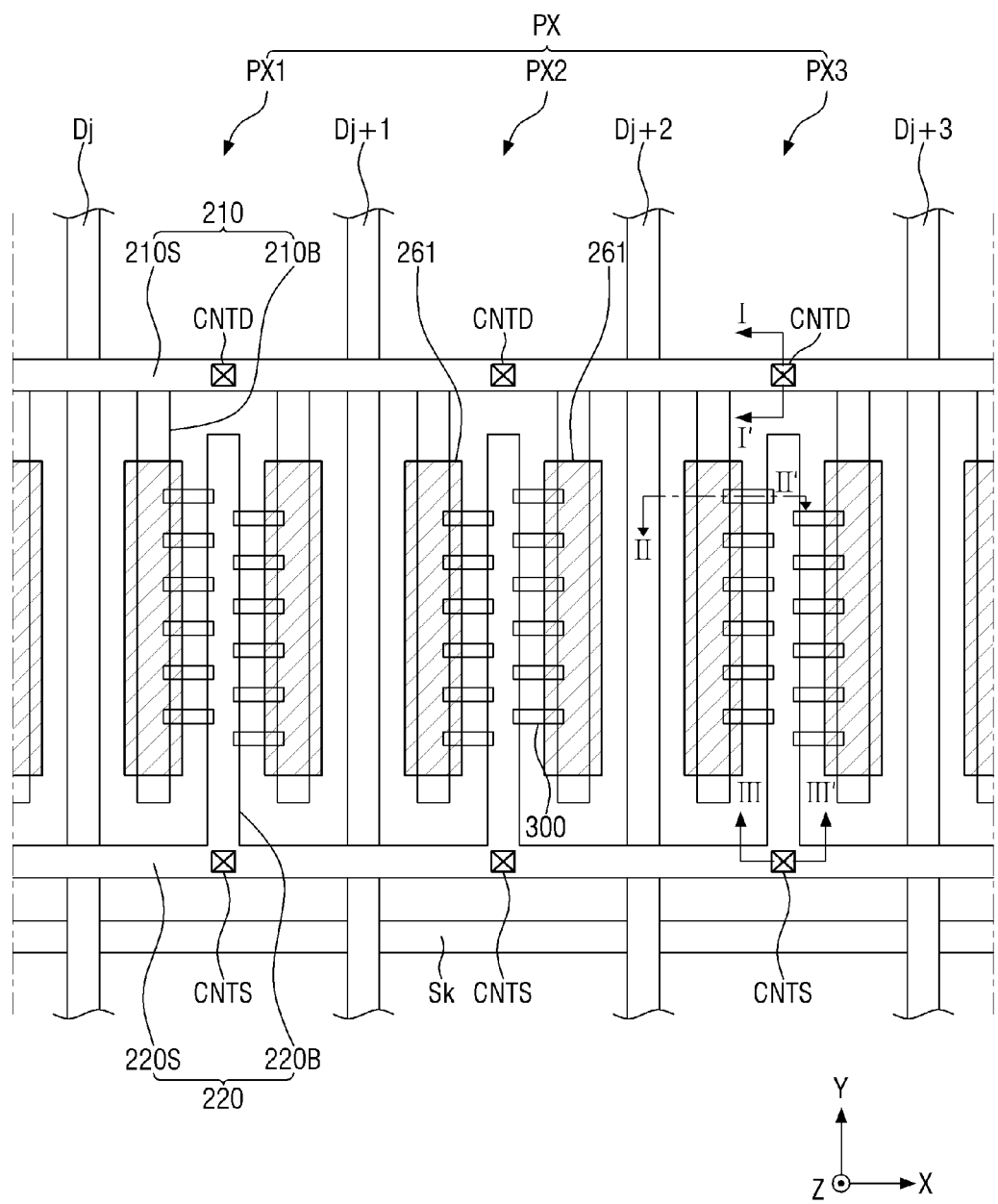
Figure 10E:
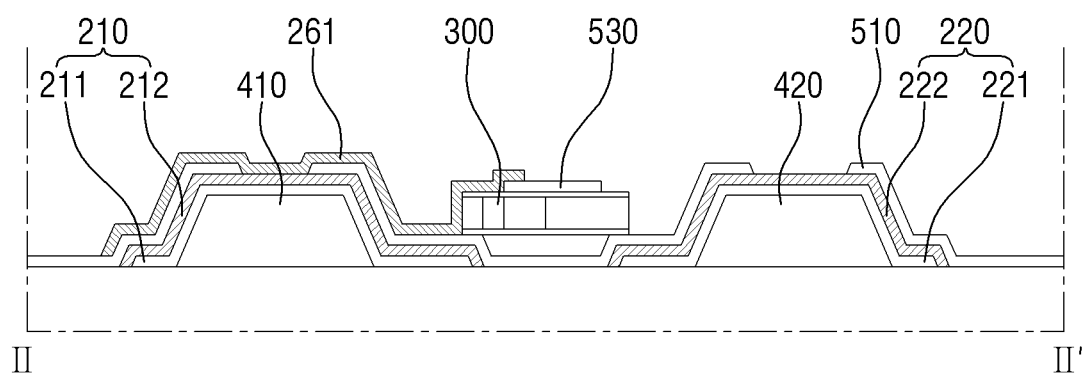

Fifth, referring to FIGS. 9E and 10E, first connection electrodes 261 electrically connecting the first electrodes 210 to the first conductive semiconductors of the light emitting elements 300 are formed (step S105 of FIG. 8).

Specifically, the first insulating material layer 510' is partially etched to form the first insulating layer 510. The first insulating layer 510 may be formed to expose at least portions of the first electrode layers 212 of the first electrodes 210 and the second electrode layers 222 of the second electrodes 220.

Then, first connection electrodes 261 are formed on the first insulating layer 510 overlapping the first partition wall 410. Each of the first connection electrodes 261 may be electrically connected to the first electrode layer 212 of the first electrode 210 which is exposed without being overlapped by the first insulating layer 510. Further, each of the first connection electrodes 261 may be electrically connected to an end of the light emitting element 300. Accordingly, each of the first connecting electrodes 261 may be electrically connected to the first conductive semiconductor 310 at an end of the light emitting element 300.

A third insulating layer 540 may be formed to overlap the first connecting electrodes 261 and the second insulating layer 530. The third insulating layer 540 may be formed of or include an inorganic layer, for example, a silicon nitride layer, a silicon oxynitride layer, a silicon oxide layer, a titanium oxide layer, or an aluminum oxide layer.

Figure 9F:
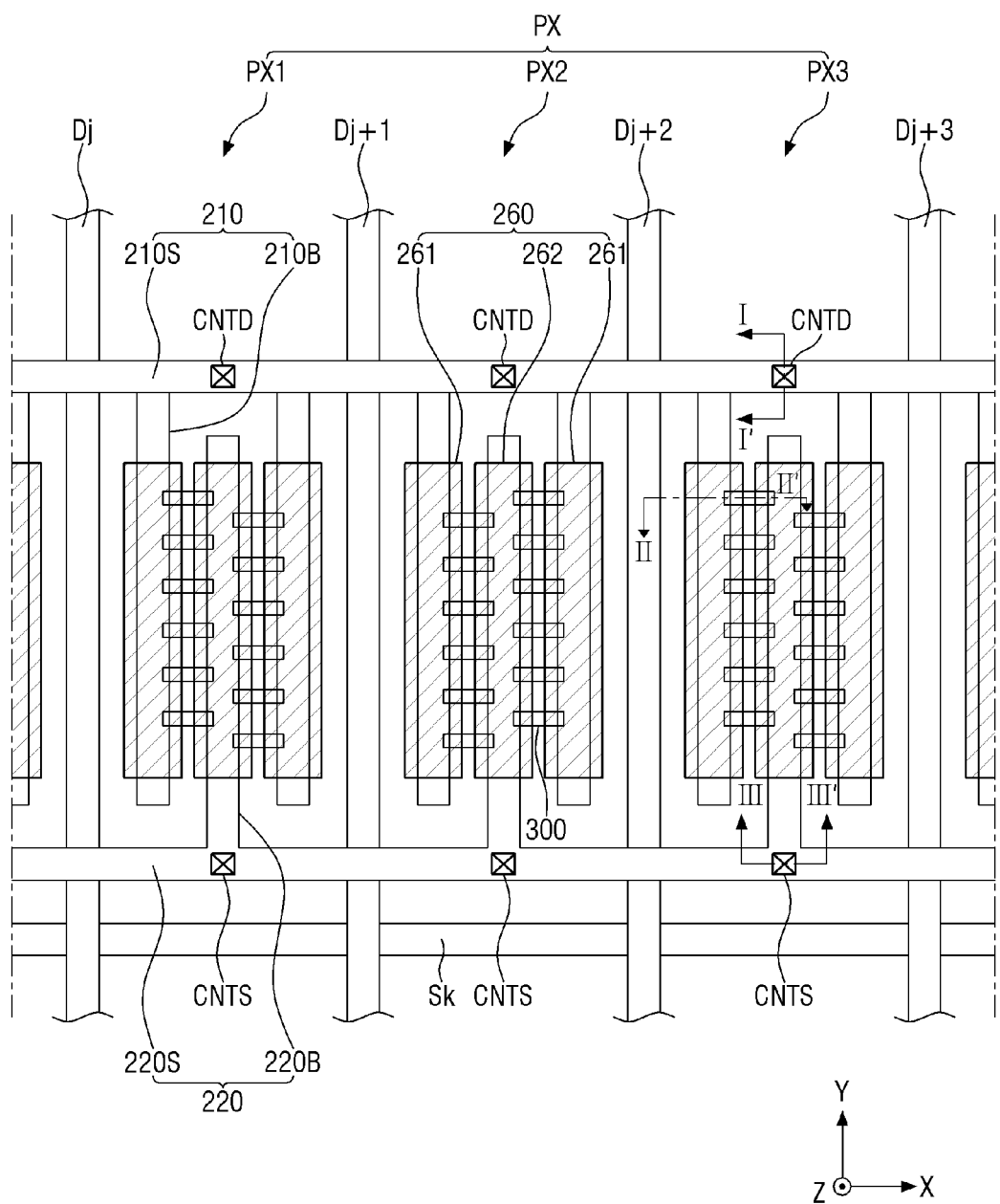
Figure 10F:
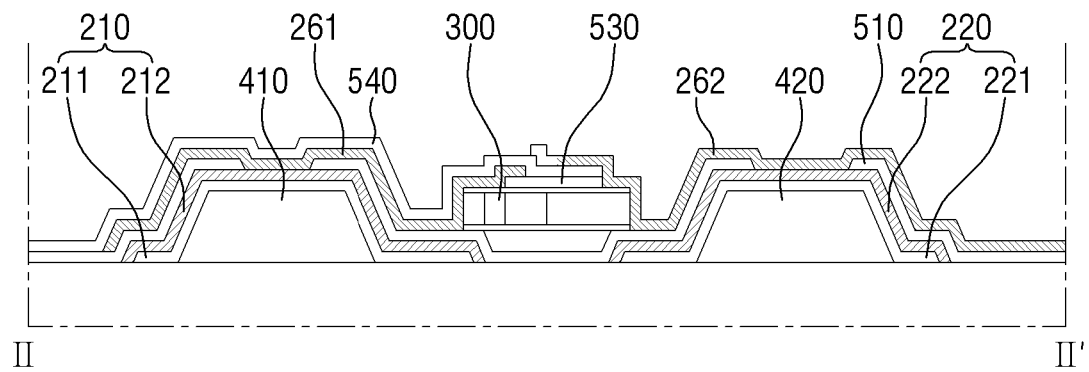

Sixth, referring to FIGS. 9F and 10F, second connection electrodes 262 electrically connecting the second electrodes 220 to the second conductive semiconductors of the light emitting elements 300 are formed (step S106 of FIG. 8).

Specifically, second connection electrodes 262 are formed on the first insulating layer 510 overlapping the second partition wall 420. Each of the second connection electrodes 262 may be electrically connected to the second electrode layer 222 of the second electrode 220 which is exposed without being overlapped by the first insulating layer 510. Further, the second connection electrodes 262 may be electrically connected to another end of the light emitting element 300. Accordingly, each of the second connection electrodes 262 may be electrically connected to the second conductive semiconductor of the another end of the light emitting element 300.

Then, a fourth insulating layer 550 may be formed to overlap the second connecting electrodes 262 and the third insulating layer 540. The fourth insulating layer 550 may be formed of or include an inorganic layer, for example, a silicon nitride layer, a silicon oxynitride layer, a silicon oxide layer, a titanium oxide layer, or an aluminum oxide layer.

Figure 9G:
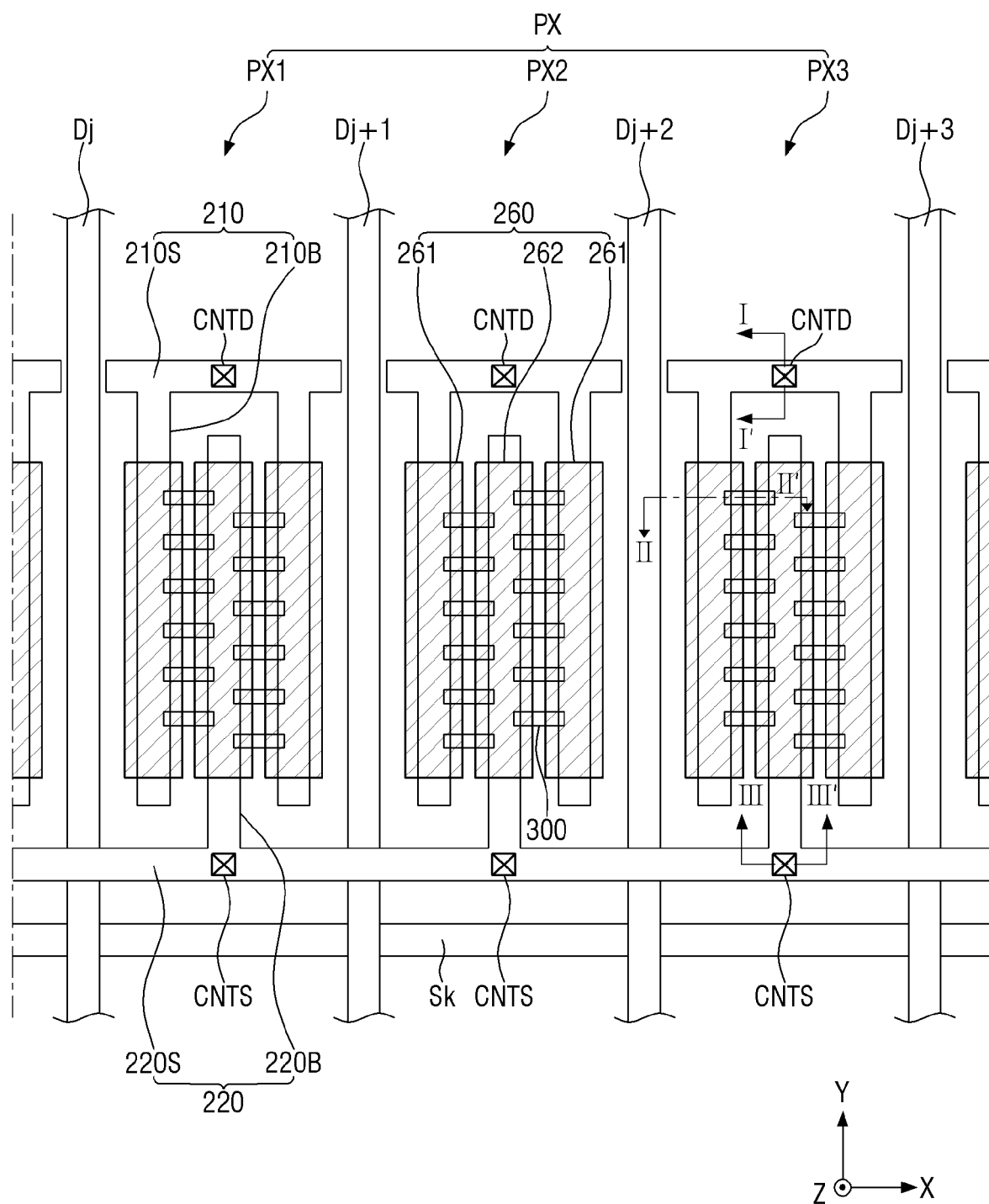
Figure 10G:
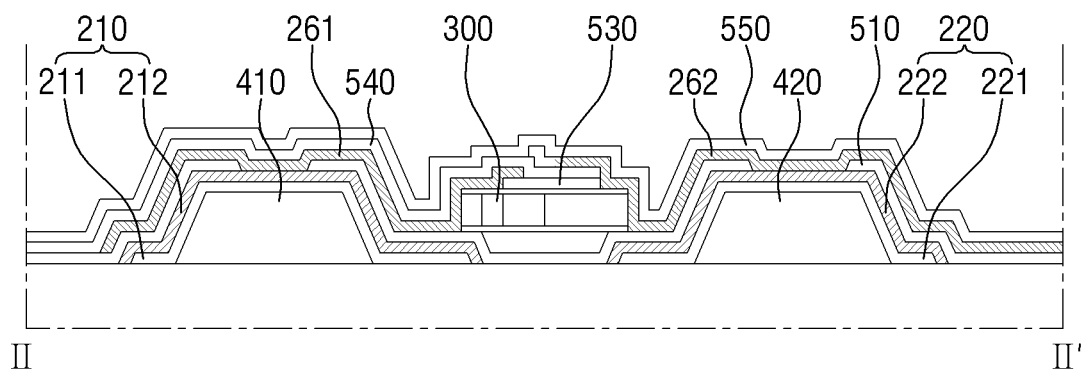

Seventh, referring to FIGS. 9G and 10G, the first electrodes 210 electrically connected to each other are disconnected (or separated) (step S107 of FIG. 8).

During the manufacturing process of FIGS. 9A to 9F and 10A to 10F, the light emitting elements 300 are aligned by an electric field formed between the first electrode 210 and the second electrode 220 by a dielectrophoretic method. For this purpose, the first electrodes 210 should be electrically connected to the first floating line FL1 and second floating line FL2 formed in the non-display area NDA to receive a ground voltage. Therefore, the first electrodes 210 may extend in the first direction (X-direction) without being disconnected.

The first electrode 210 of each of the first sub-pixel PX1, second sub-pixel PX2 and third sub-pixel PX3 of each of the pixels PX is electrically connected to the thin film transistor 120 through the first electrode contact hole CNTD to receive a predetermined driving voltage from the thin film transistor 120. Therefore, in order to drive the first sub-pixel PX1, second sub-pixel PX2 and third sub-pixel PX3 of each of the pixels PX, the first electrodes 210 should not be electrically connected to each other. Thus, after the manufacturing process of FIGS. 9A to 9F and 10A to 10F is completed, the first electrodes 210 may be disconnected so as to be spaced apart from each other by a predetermined distance in the first direction (X-direction).

The first electrode 210 of the first sub-pixel PX1 of each of the pixels PX may be disconnected from the first electrode 210 of the second sub pixel PX2 adjacent thereto, the first electrode 210 of the second sub-pixel PX2 may be disconnected from the first electrode 210 of the third sub-pixel PX3 adjacent thereto, and the first electrode 210 of the third sub-pixel PX3 may be disconnected from the first electrode 210 of the first sub-pixel PX1 adjacent thereto. Further, the first electrodes 210 may be disconnected so as not to overlap the data lines D1 to Dm. The first electrodes 210 may be disconnected by a laser process.

According to the embodiment shown in FIG. 8, an electric field may be formed between the first electrode 210 and the second electrode 220 in the manufacturing process of the display panel 10, thereby aligning the light emitting elements 300 between the first electrode 210 and the second electrode 220 in the first direction (X-direction).

In the case where the first electrode 210 is an anode electrode and the second electrode 220 is a cathode electrode, only in case that the first conductive semiconductor (p-type) of the light emitting element 300 is electrically connected to the first electrode 210 and the second conductive semiconductor (n-type) is electrically connected to the second electrode 220, a current may flow through the light emitting element 300. For example, the light emitting element 300 may emit light in the case of forward alignment in which the first conductive semiconductor (p-type) is disposed adjacent to the first electrode 210 and the second conductive semiconductor (n-type) is disposed adjacent to the second electrode 220. The light emitting element 300 may not emit light in the case of reverse alignment in which the first conductive semiconductor (p-type) is disposed adjacent to the second electrode 220 and the second conductive semiconductor (n-type) is disposed adjacent to the first electrode 210.

Figure 11:
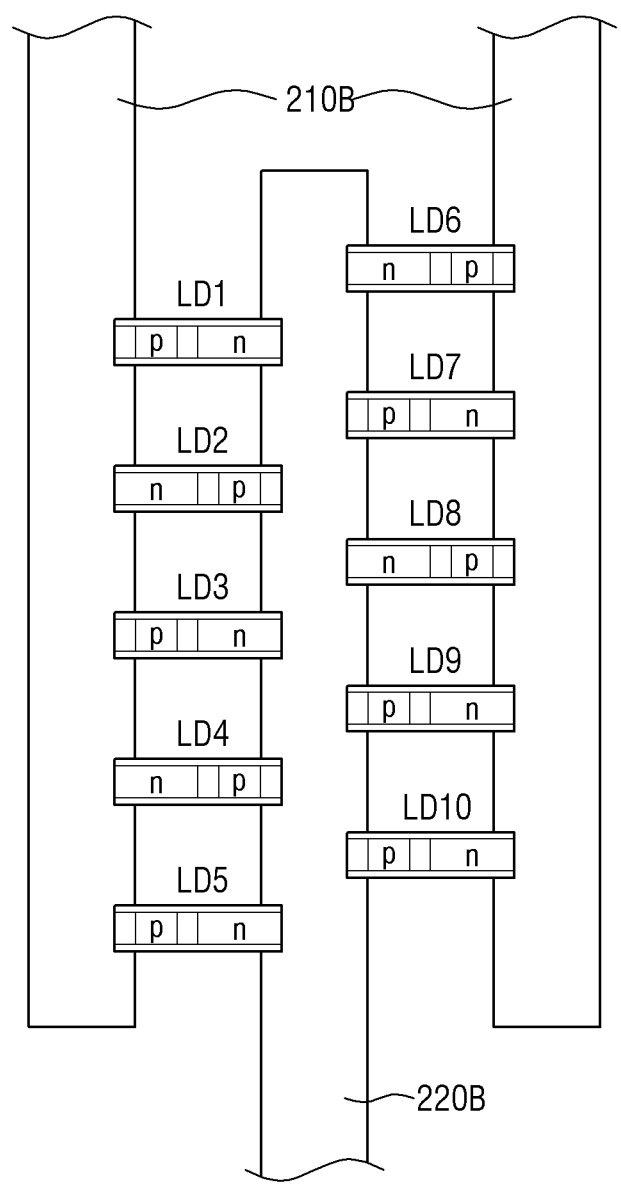
FIG. 11 is a schematic plan view illustrating a pixel including light emitting elements, a first electrode branch portion, and a second branch portion which are aligned in case that an AC voltage having a sinusoidal waveform of a high frequency is applied to a second electrode.
Figure 12:
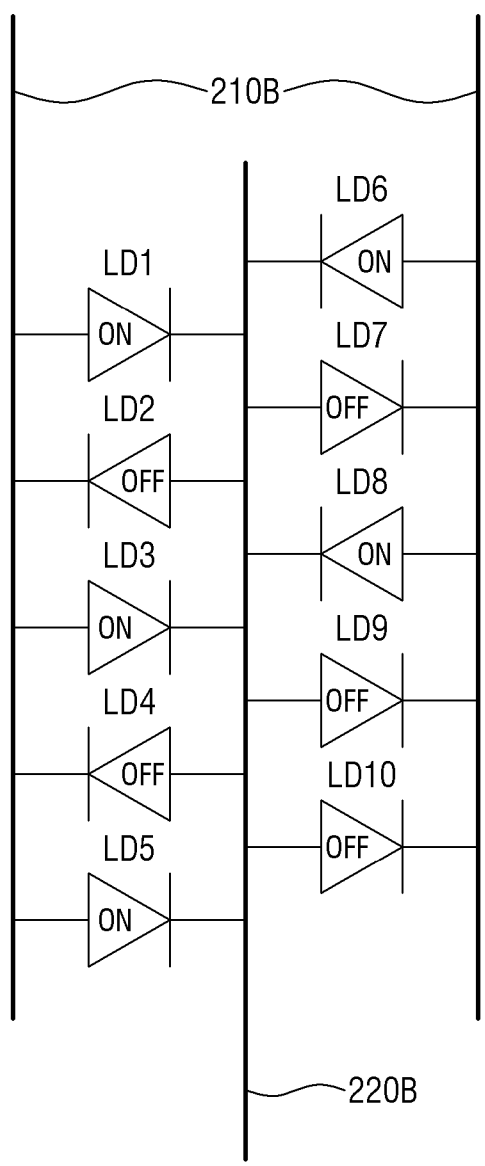
FIG. 12 is a schematic equivalent circuit diagram of FIG. 11.

In case that an AC voltage having a sinusoidal wave of a high frequency is applied to the second electrode 220 as shown in FIG. 11, some of the light emitting elements 300, for example, first, third, fifth, sixth, and eighth light emitting elements LD1, LD3, LD5, LD6, and LD8 are aligned in the forward direction, and others of the light emitting elements 300, for example, second, fourth, seventh, ninth, and tenth light emitting elements LD2, LD4, LD7, LD9, and LD10 are aligned in the reverse direction. In this case, as shown in FIG. 12, only the first, third, fifth, sixth, and eighth light emitting elements LD1, LD3, LD5, LD6, and LD8 emit light, and the second, fourth, seventh, ninth, and tenth light emitting elements LD2, LD4, LD7, LD9, and LD10 do not emit light. Therefore, the luminance of the sub-pixel may be lowered. Accordingly, a method of increasing the accuracy of alignment of the light emitting elements 300 is required.

Hereinafter, a method of aligning the light emitting elements 300, which can increase alignment accuracy, will be described in detail with reference to FIG. 13.

Figure 13:
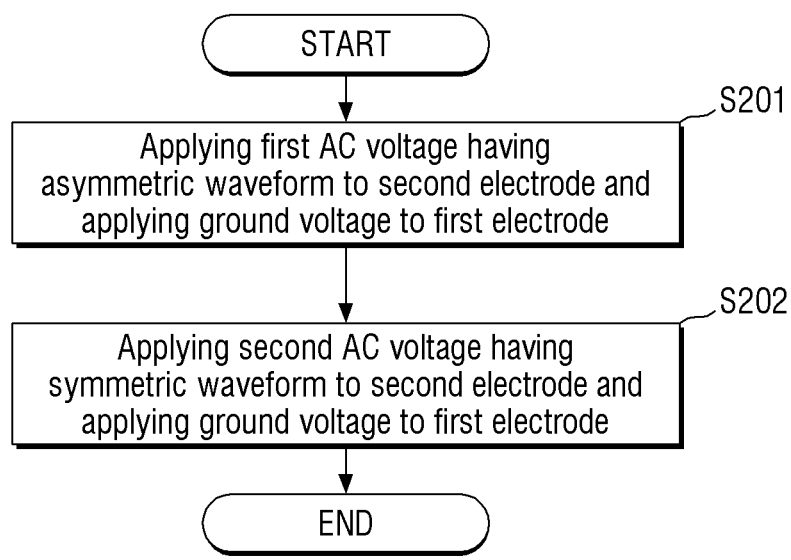
FIG. 13 is a flowchart illustrating a method of aligning light emitting elements according to an embodiment.

FIG. 13 is a flowchart illustrating a method of aligning light emitting elements according to an embodiment. FIG. 13 illustrates a method of increasing the accuracy of alignment of the light emitting elements 300 in step S103 of FIG. 8.

First, referring to FIG. 13, a first AC voltage having an asymmetric waveform is applied to the second electrode 220, and a ground voltage is applied to the first electrode 210 (step S201 of FIG. 13).

Figure 14:
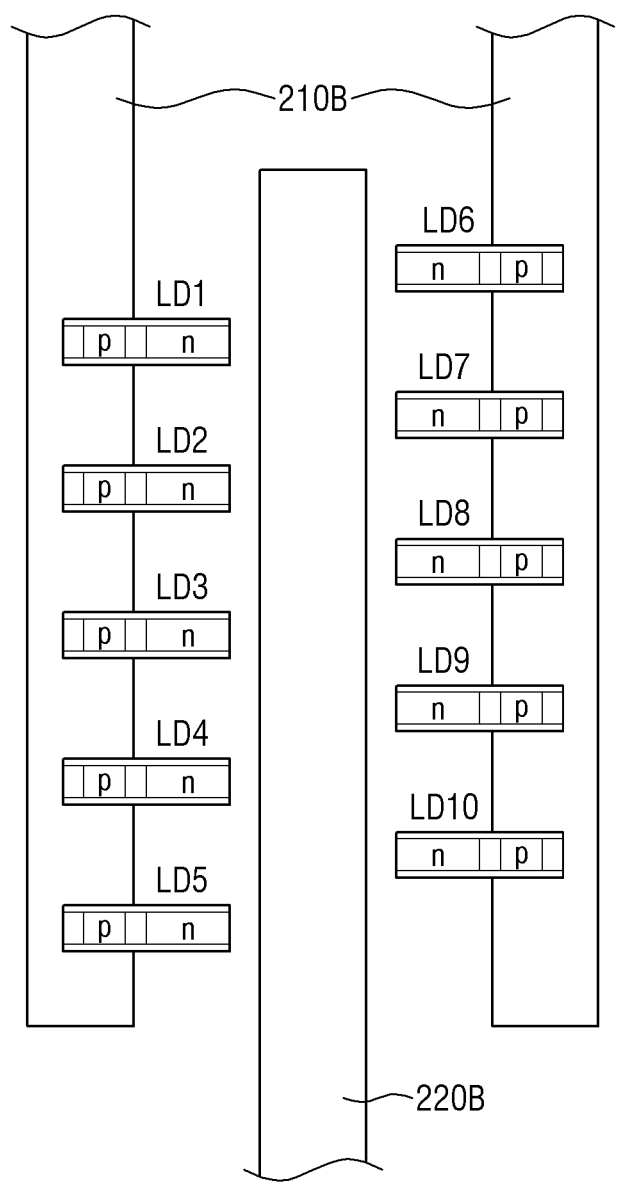
FIG. 14 is a schematic plan view illustrating the alignment of light emitting elements in case that a first AC voltage having an asymmetric waveform is applied to a second electrode.
Figure 17A:
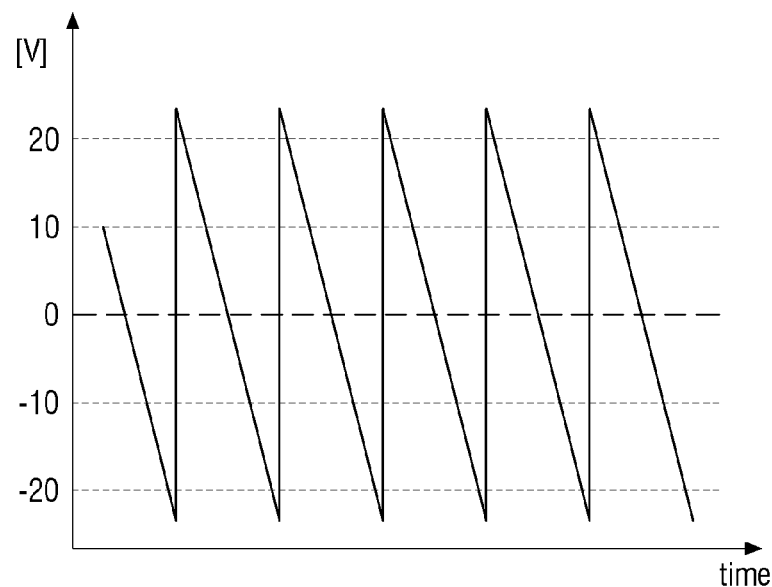
FIGS. 17A and 17B are graphs illustrating waveforms of the first AC voltage and electric fields formed in accordance with the waveforms.
Figure 19A:
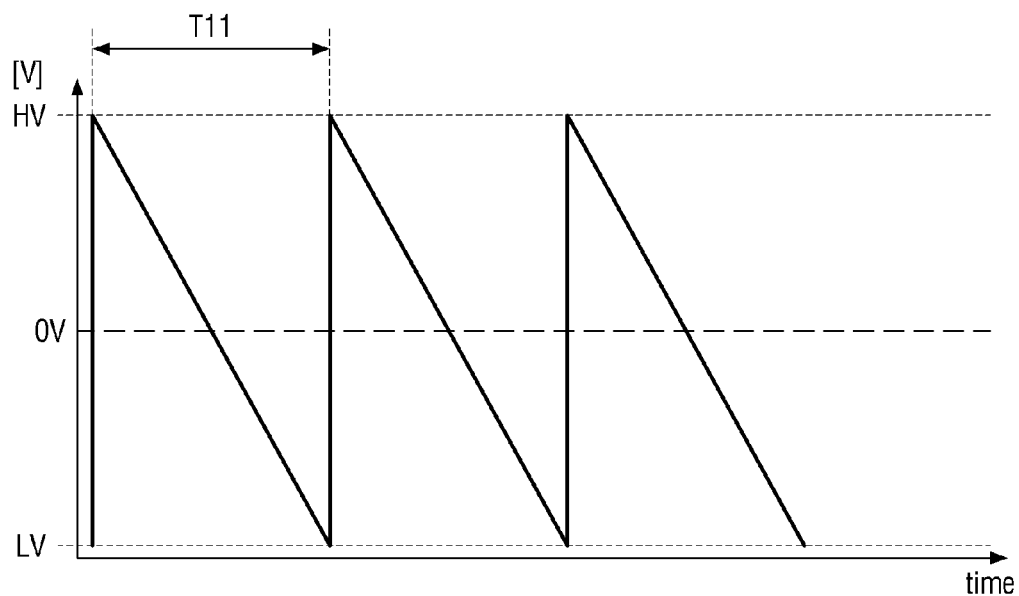
FIGS. 19A to 19N are waveform diagrams illustrating examples of a first AC voltage having an asymmetric waveform.
Figure 19B:
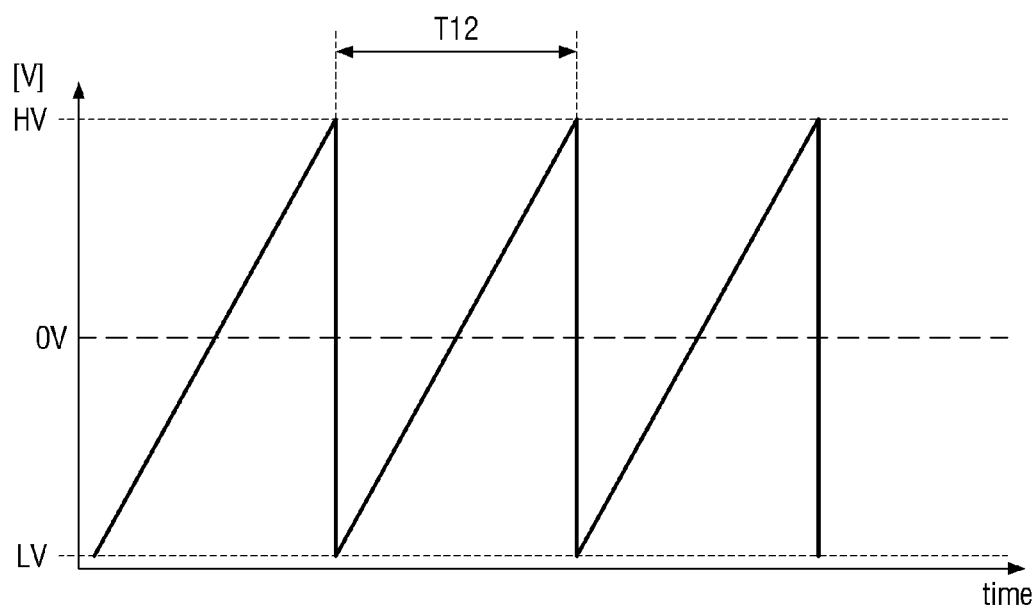
Figure 19C:
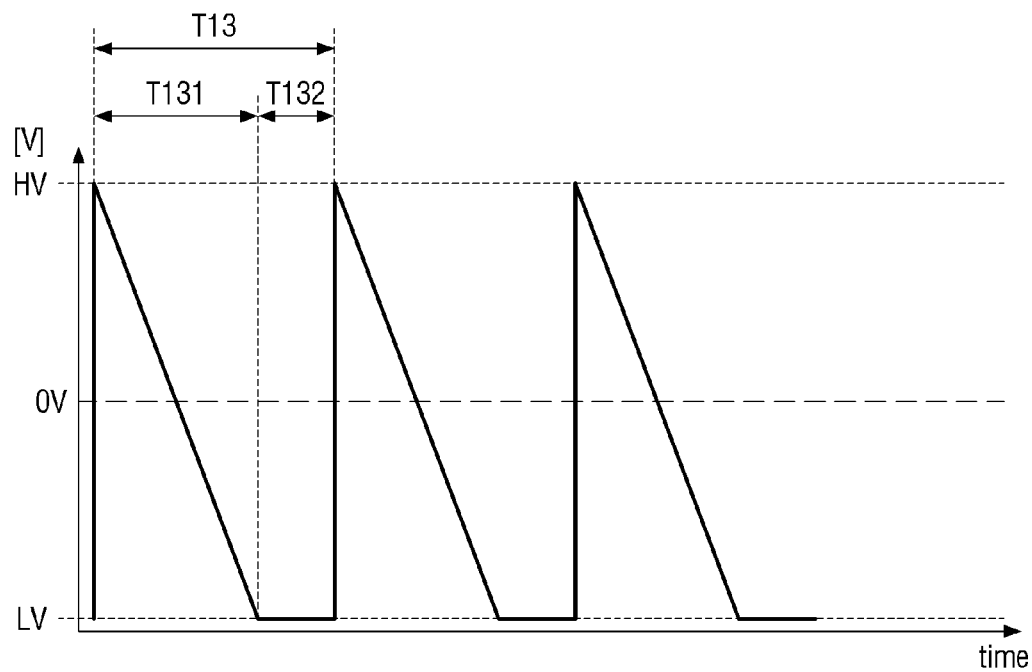
Figure 19D:
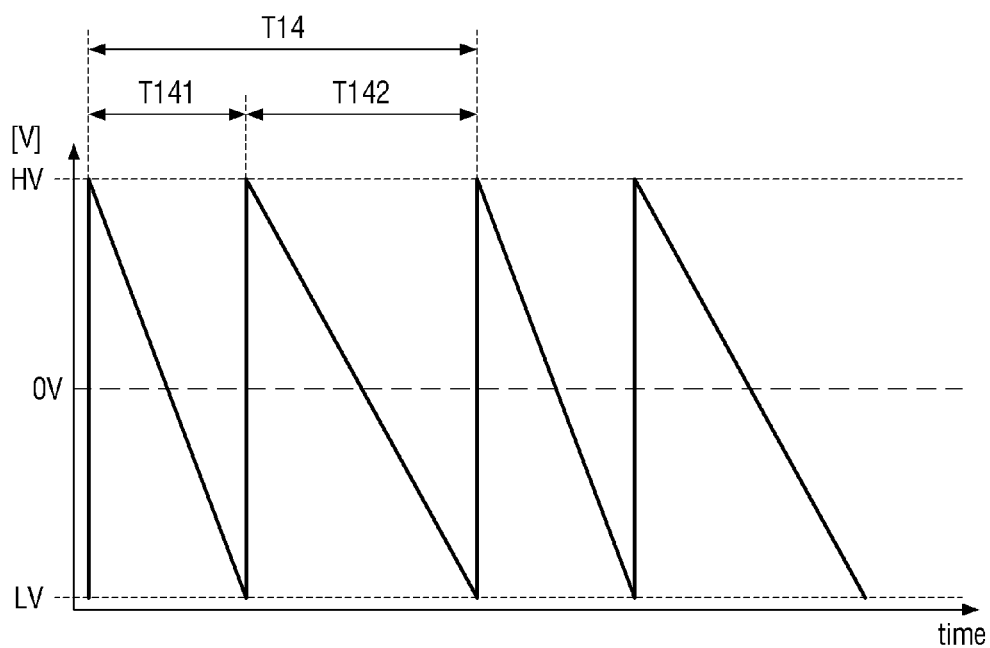
Figure 19E:
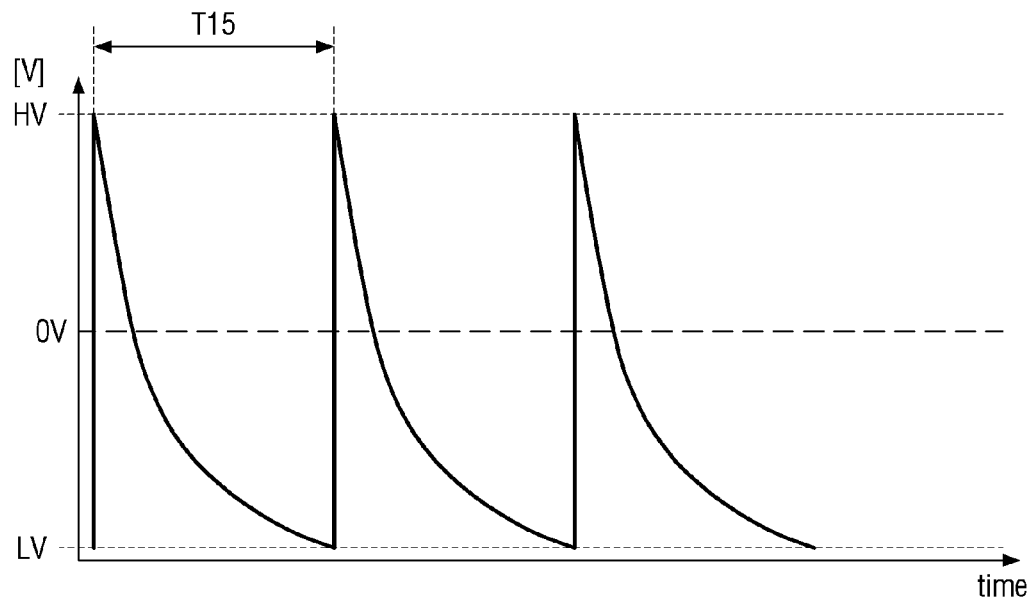
Figure 19F:
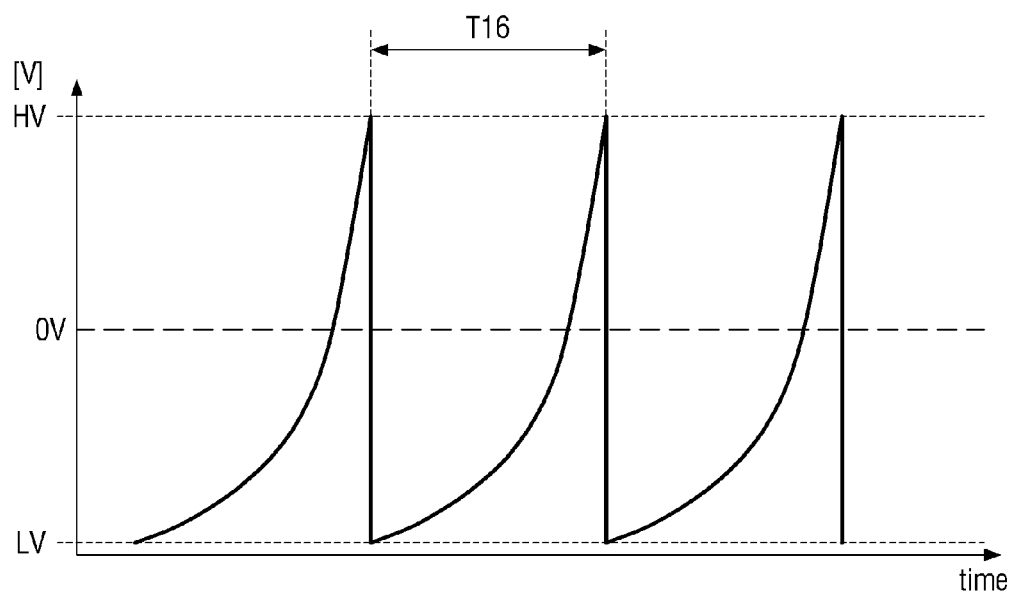
Figure 19G:
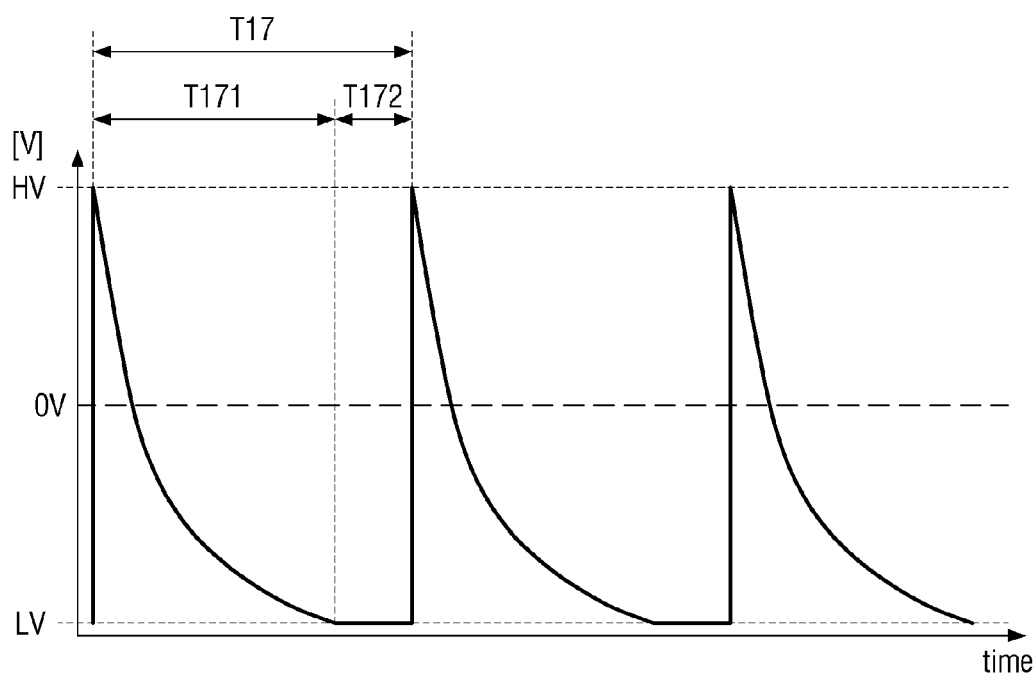
Figure 19H:
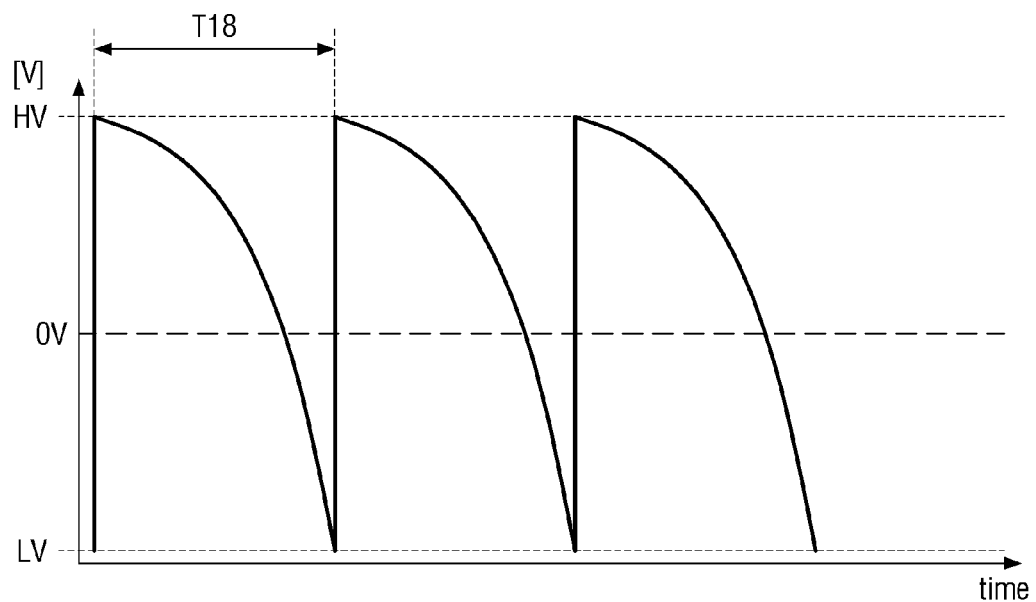
Figure 19I:
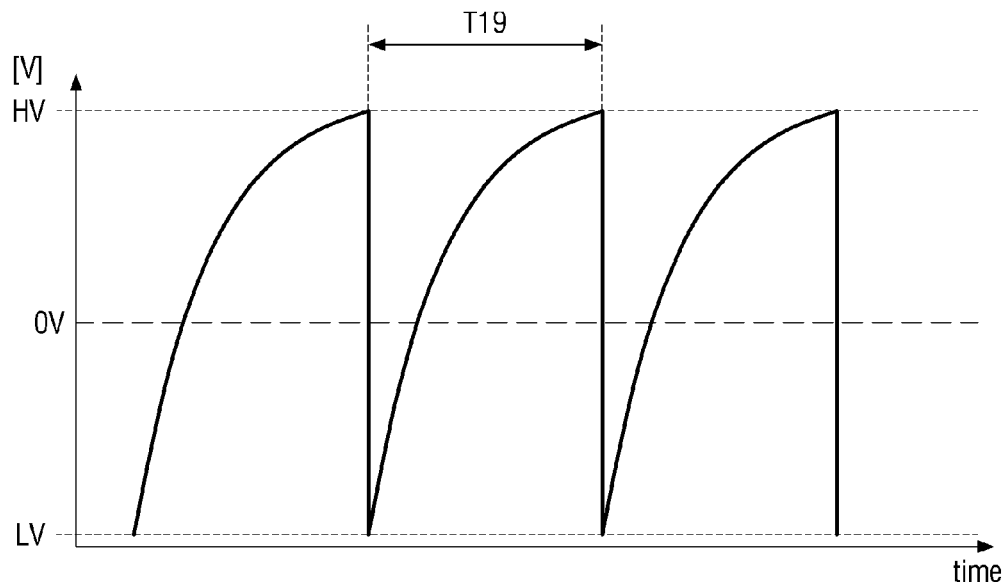
Figure 19J:
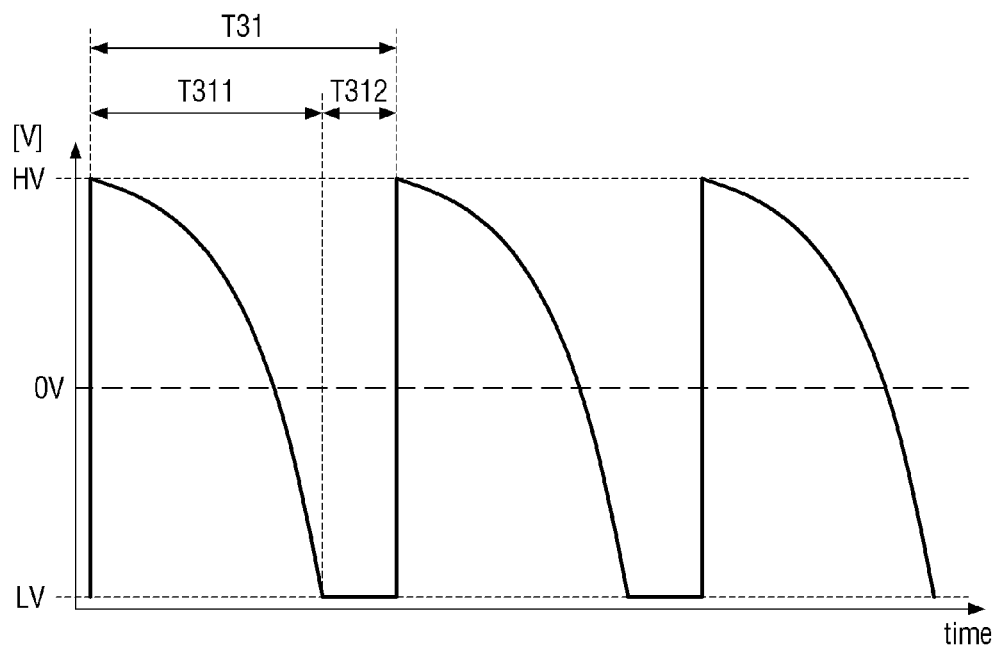
Figure 19K:
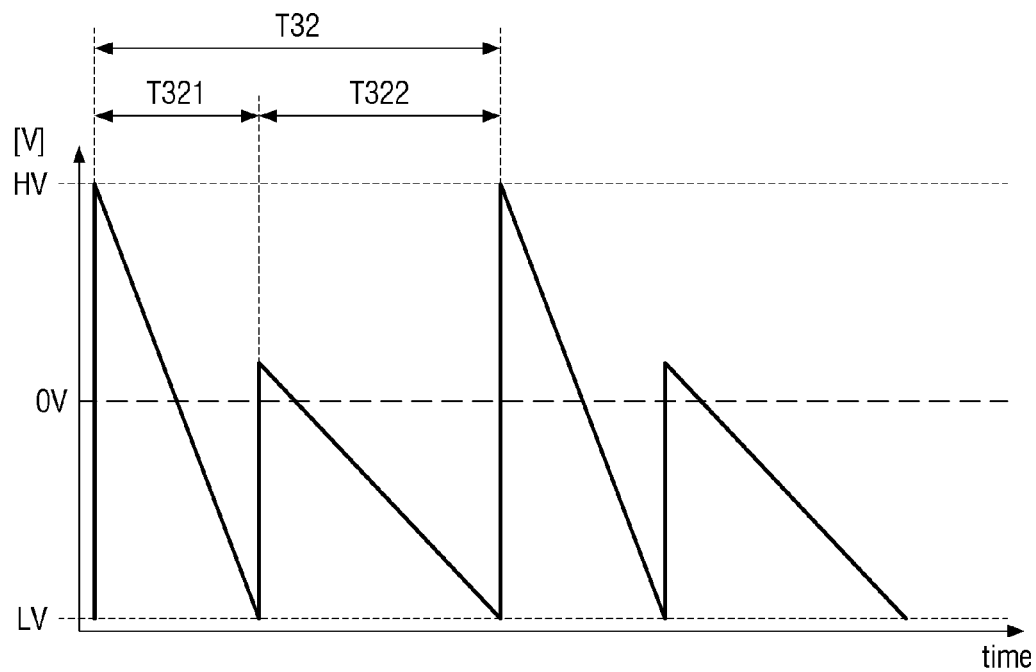
Figure 19L:
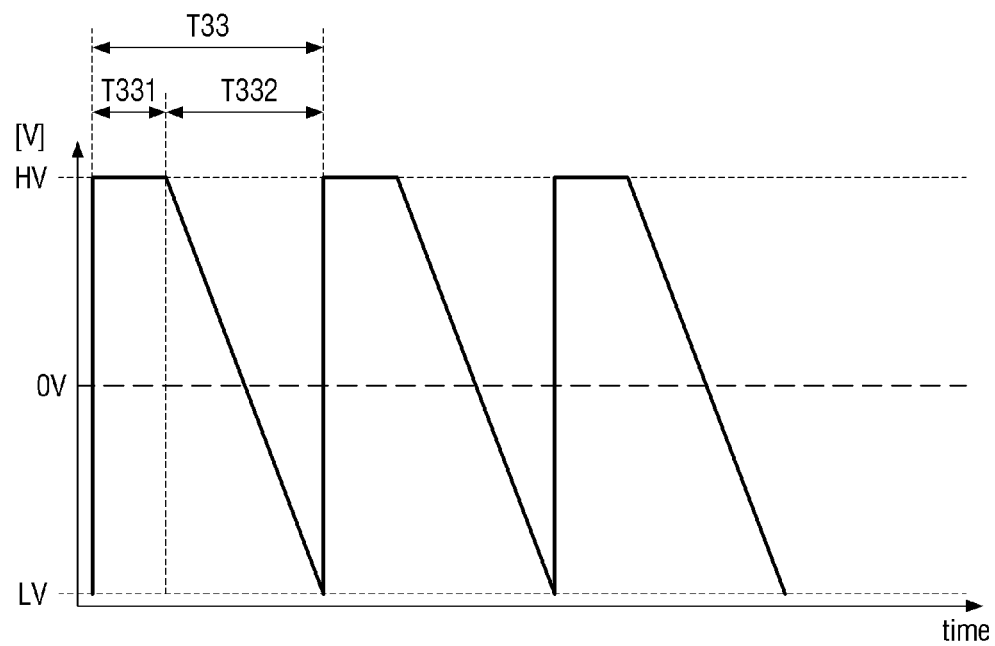
Figure 19M:
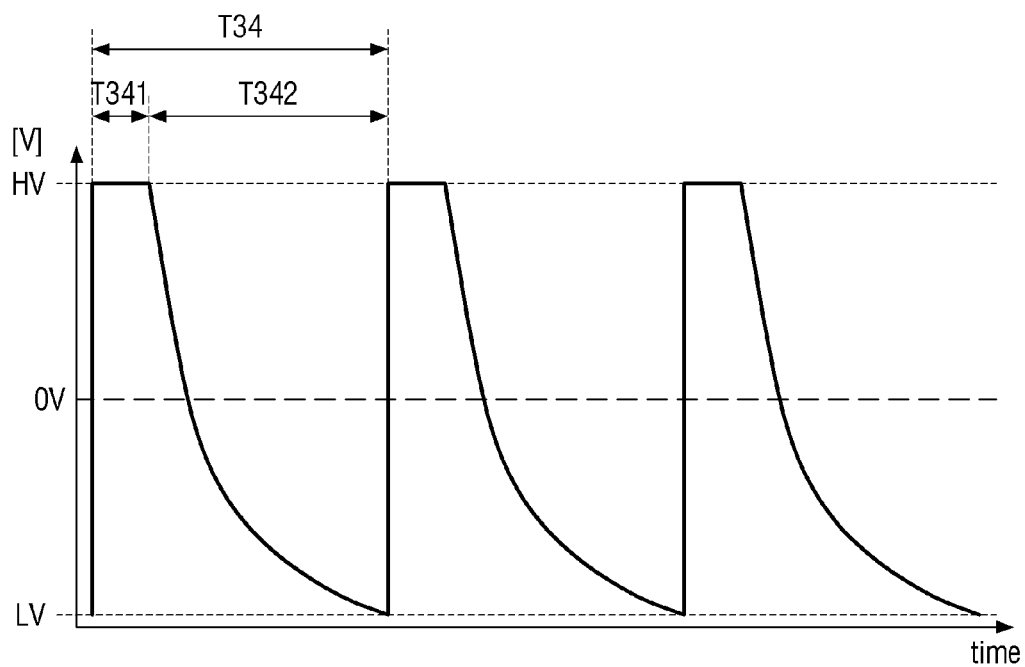
Figure 19N:
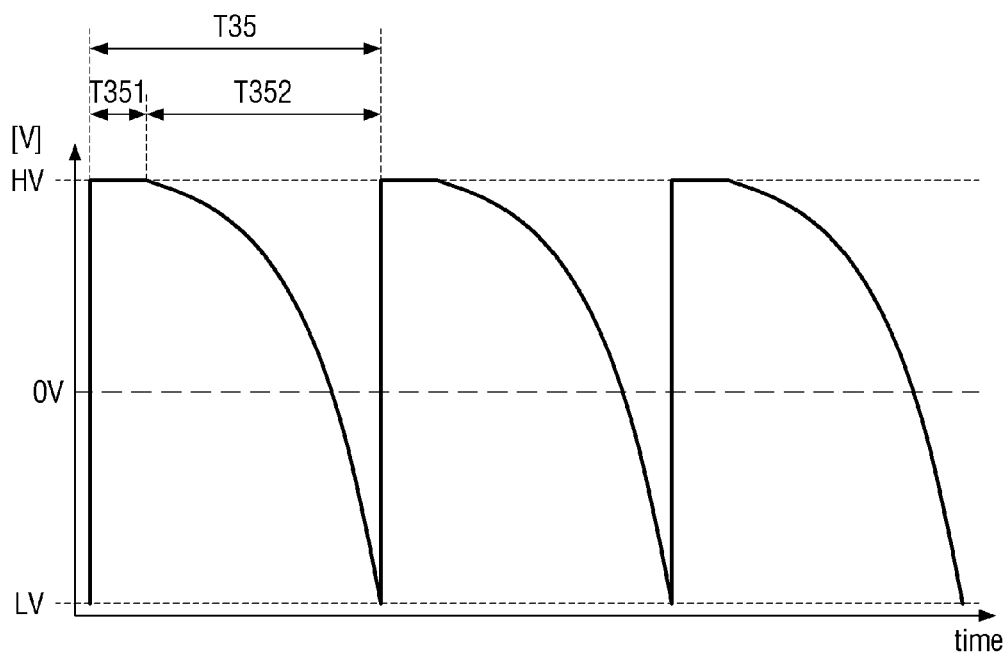

As shown in FIGS. 17A and 19A to 19N, in case that a first AC voltage having an asymmetric waveform is applied to the second electrode 220 and a ground voltage is applied to the first electrode 210, the light emitting elements 300 may be arranged to be disposed (or deflected) toward the first electrode 210 as shown in FIG. 14. Details of the first AC voltage having an asymmetric waveform will be described with reference to FIGS. 17A and 19A to 19N.

In case that the light emitting elements 300 are disposed toward the first electrode 210 as shown in FIG. 14, the first conductive semiconductors (p-type) of the light emitting elements 300 may overlap the first electrode branch portion 210B, whereas the second conductive semiconductors (n-type) thereof may not overlap the second electrode branch portion 220B. The first conductive semiconductors (p-type) of the light emitting elements 300 may be arranged toward the first electrode 210. Hereinafter, a case where the first conductive semiconductors (p) of the light emitting elements 300 are arranged toward the first electrode 210 will be described in detail.

Figure 15:
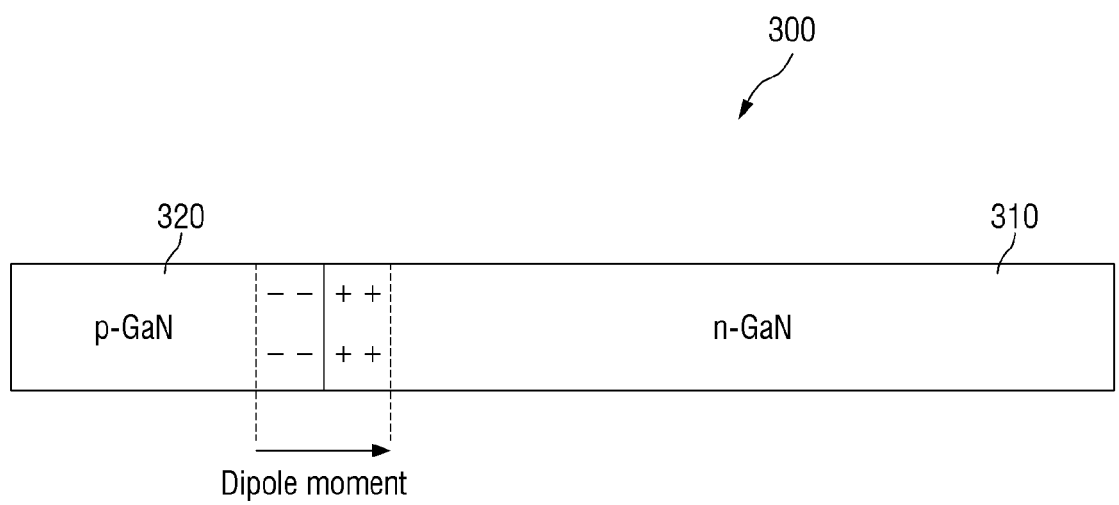
FIG. 15 is a schematic diagram illustrating a light emitting element for explaining a dipole moment.

In case that the light emitting element 300 includes the first conductive semiconductor (p-type) made of GaN doped with a p-type dopant and the second conductive semiconductor (n-type) made of GaN doped with an n-type dopant, as shown in FIG. 15, holes of GaN doped with a p-type dopant, which is rich in holes, migrate to GaN doped with an n-type dopant, and electrons of GaN doped with an n-type dopant, which is rich in electrons, migrate to GaN doped with a p-type dopant. Thus, a permanent dipole moment may be generated in a direction from the GaN doped with a p-type dopant toward the GaN doped with an n-type dopant. For example, the light emitting element 300 may be defined as a particle having polarity in the length direction.

Figure 16:
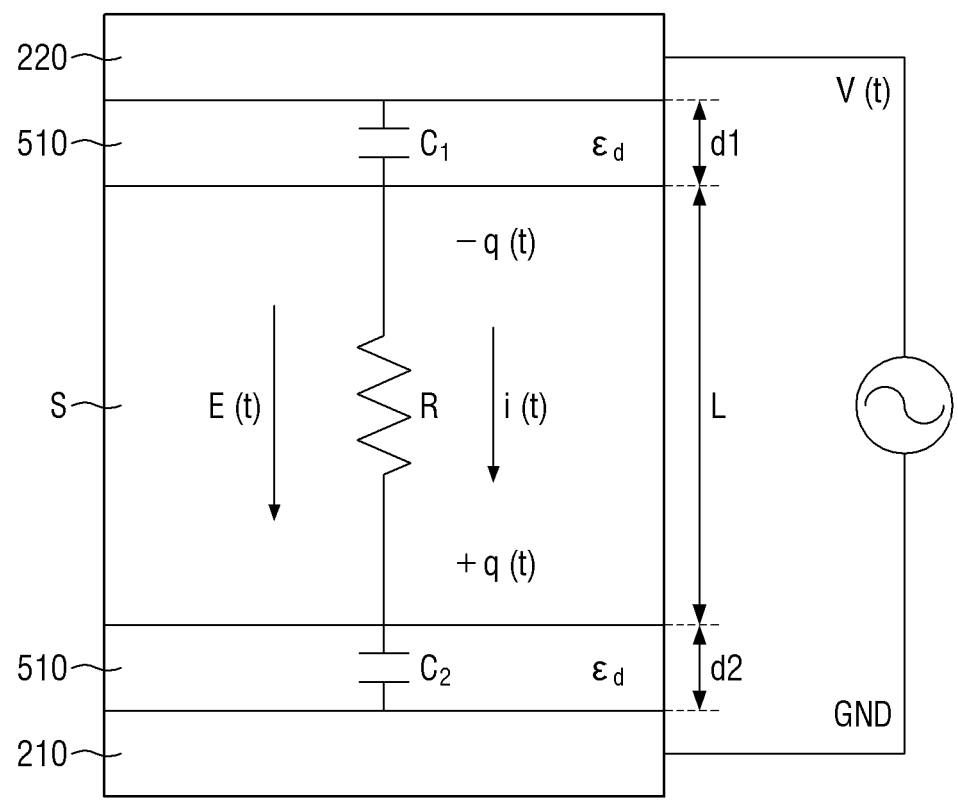
FIG. 16 is a schematic equivalent circuit diagram of a first electrode, a second electrode, and a coating solution in case that an electric field is formed between the first electrode and the second electrode as shown in FIG. 10C.

In case that an electric field is formed between the first electrode and the second electrode as shown in FIG. 10C, an equivalent circuit diagram of the first electrode 210, the second electrode 220, and the coating solution S may be shown in FIG. 16. In this case, the AC voltage V (t) applied to the second electrode 220 may be represented by Equation 1.

$$V(t) = R \cdot i(t) + \frac{q(t)}{C_1} + \frac{q(t)}{C_2} \qquad \text{[Equation 1]}$$

In Equation 1, V (t) indicates an AC voltage applied to the second electrode 220, R indicates a resistance of the coating solution S, i(t) indicates a current flowing through the coating film S, $C_1$ and $C_2$ indicate respective capacitances of the first and second capacitors, and q (t) indicates a charge induced in the first insulating material layer 510'. $C_1$ of Equation 1 is represented by Equation 2.

$$C_1 = \frac{\varepsilon_d \varepsilon_0 A1}{d1} \qquad \text{[Equation 2]}$$

In Equation 2, $\varepsilon_d$ indicates a relative permittivity of the first insulating material layer 510', $\varepsilon_o$ indicates a permittivity in vacuum, A1 indicates a surface area of the first capacitor, and d1 indicates a thickness of the first insulating material layer 510'. C2 of Equation 1 may be represented by an equation similar to Equation 2 with A1 and d1 replaced by A2 (a surface area of the second capacitor) and d2 (another thickness of the first insulating material layer 510').

When Equation 1 is replaced by i(t)=dq(t)/dt and then rearranged, Equation 3 may be derived.

$$\frac{dq(t)}{dt} = \frac{1}{R}\left\{V(t) - \frac{C_1 + C_2}{C_1 C_2} q(t)\right\} \qquad \text{[Equation 3]}$$

When an electric field is calculated from Equation 3, Equation 4 may be derived.

$$E(t) = \frac{R \cdot i(t)}{L} = \frac{R}{L} \cdot \frac{dq(t)}{dt} = \frac{1}{L}\left\{V(t) - \frac{C_1 + C_2}{C_1 C_2} q(t)\right\} \qquad \text{[Equation 4]}$$

Figure 17B:
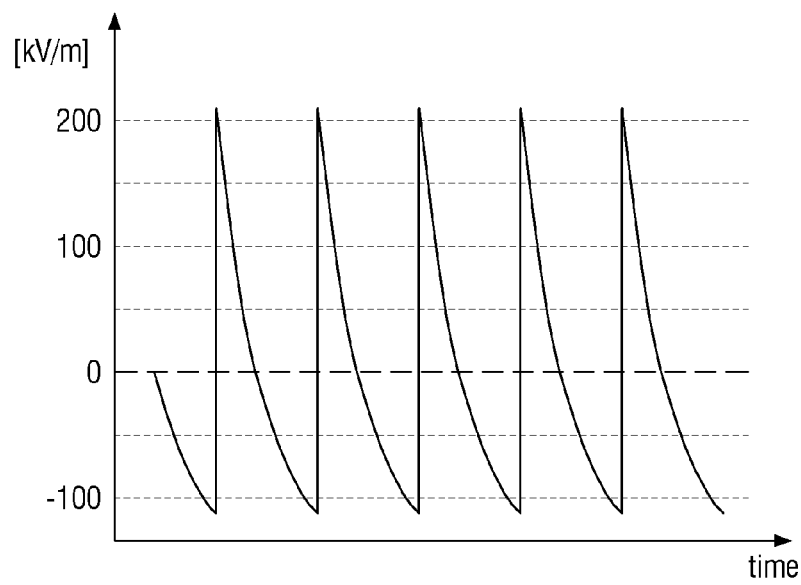
Figure 18:
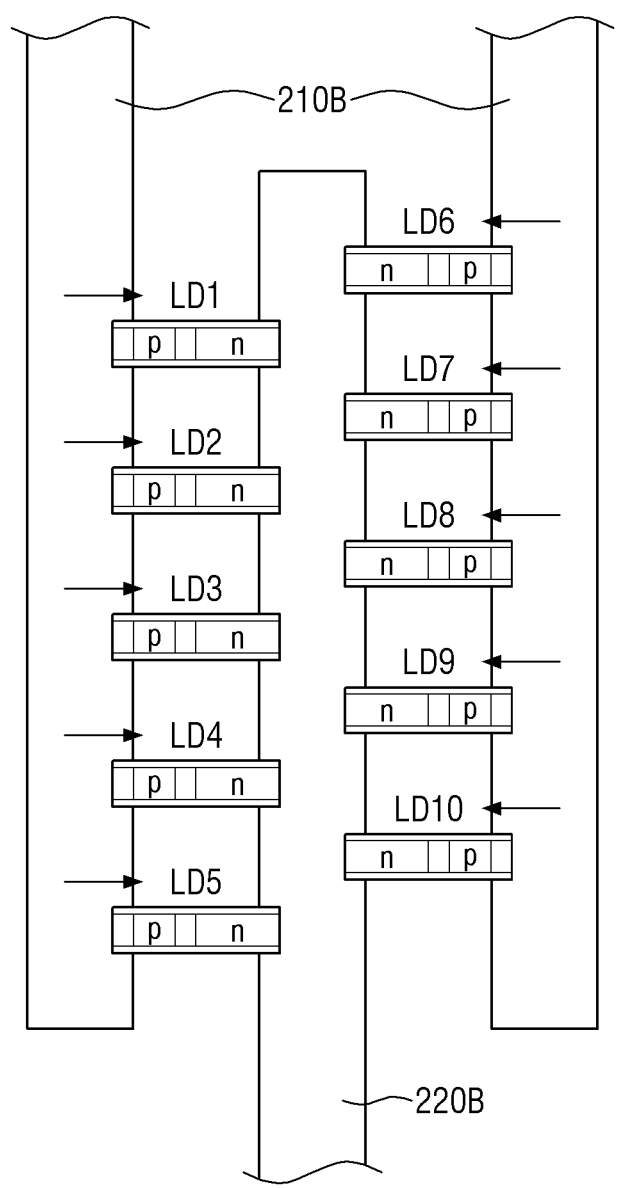
FIG. 18 is a schematic plan view illustrating the alignment of light emitting elements when a second AC voltage having a symmetric waveform is applied to a second electrode.

The electric field derived by substituting an asymmetric waveform, i.e., a sawtooth waveform shown in FIG. 17A, into Equation 4 has a waveform different from the sawtooth waveform, as shown in FIG. 17B. In this case, as shown in FIG. 17B, this electric field may be an asymmetric electric field in which the sum of the area of positive polarity and the area of negative polarity is not 0. For example, the electric field generated by the first AC voltage may be an asymmetric electric field in which negative polarity is dominant, as shown in FIG. 17B. Although it is illustrated in FIG. 17B that the electric field generated by the first AC voltage is an asymmetric electric field in which negative polarity is dominant, the disclosure is not limited thereto. For example, the electric field generated by the first AC voltage may be an asymmetric electric field in which positive polarity is dominant.

The asymmetric electric field may make an influence on the permanent dipole moment of the light emitting element 300 having been described with reference to FIG. 15. Therefore, the first conductive semiconductors (p-type) of the light emitting elements 300 may be arranged toward the first electrode 210.

The frequency of the first AC voltage may be about 1 Hz to about 1 kHz or about 10 Hz to about 500 Hz. In case that the frequency of the first AC voltage exceeds about 1 kHz, the period of the first AC voltage is shortened, so that it is difficult to form an asymmetric electric field as shown in FIG. 17B even if the first AC voltage having an asymmetric waveform is applied as shown in FIG. 17A.

Second, a second AC voltage having a symmetric waveform is applied to the second electrode 220, and a ground voltage is applied to the first electrode 210 (step S202 of FIG. 13).

In case that the first AC voltage having an asymmetric waveform is applied to the second electrode 220, the first conductive semiconductors (p-type) of the light emitting elements 300 may be arranged toward the first electrode 210, but the light emitting elements 300 may be disposed (or deflected) toward the first electrode 210. However, in this case, the second conductive semiconductors (n-type) of the light emitting elements 300 may be spaced apart from the second electrode branch portion 220B and may thus not be electrically connected to the second connection electrodes 262 during a process of forming the second connection electrodes 262 to be described below. Therefore, in order to stably connect the second conductive semiconductors (n-type) of the light emitting elements 300 to the second electrode branch portion 220B, it is required to align the light emitting elements 300 at the center between the first electrode branch portion 210B and the second electrode branch portion 220B.

In case that the second AC voltage having a symmetric waveform is applied to the second electrode 220, the electric field formed between the first electrode 210 and the second electrode 220 may be a symmetric electric field in which the sum of the area of positive polarity and the area of negative polarity is about 0. In this case, the light emitting elements 300 are no longer disposed toward the first electrode 210 and may be aligned at the center between the first electrode branch portion 210B and the second electrode branch portion 220B. Accordingly, the second conductive semiconductors (n-type) of the light emitting elements 300 may be electrically connected to the second electrode branch portion 220B.

The frequency of the second AC voltage may be higher than the frequency of the first AC voltage. For example, the frequency of the second AC voltage may be about 1 kHz to about 100 kHz, and or about 10 kHz to about 100 kHz. As the frequency of the second AC voltage increases, the electric field formed between the first electrode 210 and the second electrode 220 also increases, and thus the light emitting elements 300 may be stably aligned at the center between the first electrode branch portion 210B and the second electrode branch portion 220B.

According to the embodiment shown in FIG. 13, since an asymmetric electric field may be formed by applying the first AC voltage having an asymmetric waveform to the second electrode 220, the light emitting elements 300 may be disposed (or deflected) toward the first electrode 210 such that the first conductive semiconductors (p-type) of the light emitting elements 300 are arranged toward the first electrode 210. Then, since a symmetric electric field may be formed by applying the second AC voltage having a symmetric waveform to the second electrode 220, the light emitting elements 300 disposed toward the first electrode 210 may be aligned at the center between the first electrode branch portion 210B and the second electrode branch portion 220B. Therefore, it is possible to increase the accuracy of alignment of the light emitting elements.

In the embodiment shown in FIG. 13, the process (step S202) of applying the second AC voltage having a symmetric waveform to the second electrode 220 may be omitted. In this case, the light emitting elements 300 may be disposed (or deflected) toward the first electrode 210 as shown in FIG. 14, but the second conductive semiconductor (n-type) of the light emitting element 300 may be electrically connected to the second connection electrode 262 in case that the second connection electrode 262 is formed to move toward the first electrode branch portion 210B by the degree of disposition (or deflection) toward the first electrode 210.

FIGS. 19A to 19N are waveform diagrams showing examples of the first AC voltage having an asymmetric waveform.

In FIGS. 19A to 19N, X-axis indicates time, and Y-axis indicates a voltage level. It is illustrated in FIGS. 19A to 19N that the first AC voltage has the highest level voltage HV and the lowest level voltage LV. In this case, the highest level voltage HV is 20 V, and the lowest level voltage LV is-20 V, but the disclosure is not limited thereto.

As shown in FIGS. 19A to 19N, the first AC voltage having an asymmetric waveform is an AC voltage in which the voltage waveform of the positive polarity region of the first AC voltage and the voltage waveform of the negative polarity region of the first AC voltage are left-right asymmetric. In FIGS. 19A to 19N, the positive polarity region of the first AC voltage indicates a region in which the first AC voltage is about 0 V or greater, and the negative polarity region of the first AC voltage indicates a region in which the first AC voltage is less than about 0 V.

As shown in FIG. 19A, the first AC voltage may have a waveform where the first AC voltage rises directly from the lowest level voltage LV to the highest level voltage HV and then falls from the highest level voltage HV to the lowest level voltage LV at a first straight slope during a period T11. The waveform of the first AC voltage shown in FIG. 19A may be referred to as a sawtooth waveform.

As shown in FIG. 19B, the first AC voltage may have a waveform where the first AC voltage rises from the lowest level voltage LV to the highest level voltage HV at a second straight slope and then falls directly from the highest level voltage HV to the lowest level voltage LV during a period T12. The waveform of the first AC voltage shown in FIG. 19B may be referred to as a lamp waveform.

As shown in FIG. 19C, the first AC voltage may have a waveform where the first AC voltage rises directly from the lowest level voltage LV to the highest level voltage HV and then falls from the highest level voltage HV to the lowest level voltage LV at a third straight slope during the first period T131 of a period T13, and maintains the lowest level voltage LV during the second period T132 of the period T13.

As shown in FIG. 19D, the first AC voltage may have a waveform where the first AC voltage rises directly from the lowest level voltage LV to the highest level voltage HV and then falls from the highest level voltage HV to the lowest level voltage LV at a fourth straight slope during the first period T141 of a period T14, and then rises directly from the lowest level voltage LV to the highest level voltage HV and then falls from the highest level voltage HV to the lowest level voltage LV at a fifth straight slope having an absolute size smaller than that of the fourth straight slope during the second period T142 of a period T14. In this case, the first period T141 may be shorter than the second period T142.

As shown in FIG. 19E, the first AC voltage may have a waveform where the first AC voltage rises directly from the lowest level voltage LV to the highest level voltage HV and then falls from the highest level voltage HV to the lowest level voltage LV at a first curved slope during a period T15. The absolute size of the first curved slope may decrease from the highest level voltage HV toward the lowest level voltage LV.

As shown in FIG. 19F, the first AC voltage may have a waveform where the first AC voltage rises from the lowest level voltage LV to the highest level voltage HV at a second curved slope and then falls directly from the highest level voltage HV to the lowest level voltage LV during a period T16. The absolute size of the second curved slope may increase from the lowest level voltage LV toward the highest level voltage HV.

As shown in FIG. 19G, the first AC voltage may have a waveform where the first AC voltage rises directly from the lowest level voltage LV to the highest level voltage HV and then falls from the highest level voltage HV to the lowest level voltage LV at a third curved slope during the first period T171 of a period T17, and then maintains the lowest level voltage LV during the second period T172 of a period T17. The absolute size of the third curved slope may decrease from the highest level voltage HV toward the lowest level voltage LV.

As shown in FIG. 19H, the first AC voltage may have a waveform where the first AC voltage rises directly from the lowest level voltage LV to the highest level voltage HV and then falls from the highest level voltage HV to the lowest level voltage LV at a fourth curved slope during a period T18. The absolute size of the fourth curved slope may increase from the highest level voltage HV toward the lowest level voltage LV.

As shown in FIG. 19I, the first AC voltage may have a waveform where the first AC voltage rises from the lowest level voltage LV to the highest level voltage HV at a fifth curved slope and then falls directly from the highest level voltage HV to the lowest level voltage LV during a period T19. The absolute size of the fifth curved slope may decrease from the lowest level voltage LV toward the highest level voltage HV.

As shown in FIG. 19J, the first AC voltage may have a waveform where the first AC voltage rises directly from the lowest level voltage LV to the highest level voltage HV and then falls from the highest level voltage HV to the lowest level voltage LV at a sixth curved slope during the first period T311 of a period T31, and then maintains the lowest level voltage LV during the second period T312 of a period T31. The absolute size of the sixth curved slope may increase from the highest level voltage HV toward the lowest level voltage LV.

As shown in FIG. 19K, the first AC voltage may have a waveform where the first AC voltage rises directly from the lowest level voltage LV to the highest level voltage HV and then falls from the highest level voltage HV to the lowest level voltage LV at a sixth straight slope during the first period T321 of a period T32, and then rises directly from the lowest level voltage LV to about 0 V and then falls from about 0 V to the lowest level voltage LV at a seventh straight slope having an absolute size smaller than that of the sixth straight slope during the second period T322 of a period T32. In this case, the first period T321 may be shorter than the second period T322.

As shown in FIG. 19L, the first AC voltage may have a waveform where the first AC voltage rises directly from the lowest level voltage LV to the highest level voltage HV and then maintains the highest level voltage HV during the first period T331 of a period T33, and falls from the highest level voltage HV to the lowest level voltage LV at an eighth straight slope during the second period T332 of a period T33.

As shown in FIG. 19M, the first AC voltage may have a waveform where the first AC voltage rises directly from the lowest level voltage LV to the highest level voltage HV and then maintains the highest level voltage HV during the first period T341 of one period T34, and then falls from the highest level voltage HV to the lowest level voltage LV at a seventh curved slope during the second period T342 of a period T34. The absolute size of the seventh curved slope may increase from the highest level voltage HV toward the lowest level voltage LV.

As shown in FIG. 19N, the first AC voltage may have a waveform where the first AC voltage rises directly from the lowest level voltage LV to the highest level voltage HV and then maintains the highest level voltage HV during the first period T351 of a period T35, and then falls from the highest level voltage HV to the lowest level voltage LV at an eighth curved slope during the second period T352 of a period T35. The absolute size of the eighth curved slope may decrease from the highest level voltage HV toward the lowest level voltage LV.

As described above, the first AC voltage having an asymmetric waveform may have a waveform where the first AC voltage rises from the lowest level voltage LV to the highest level voltage HV and then falls from the highest level voltage HV to the lowest level voltage LV at a straight or curved slope. Further, the first AC voltage having an asymmetric waveform may have a waveform where the first AC voltage rises from the lowest level voltage LV to the highest level voltage HV at a straight or curved slope and then falls from the highest level voltage HV to the lowest level voltage LV. In this case, a period of rising from the lowest level voltage LV to the highest level voltage HV and then maintaining the highest level voltage HV and a period of falling from the highest level voltage HV to the lowest level voltage LV and then maintaining the lowest level voltage LV may be included.

The first AC voltage having an asymmetric waveform according to an embodiment is not limited to the examples shown in FIGS. 19A to 19N.

Figure 20A:
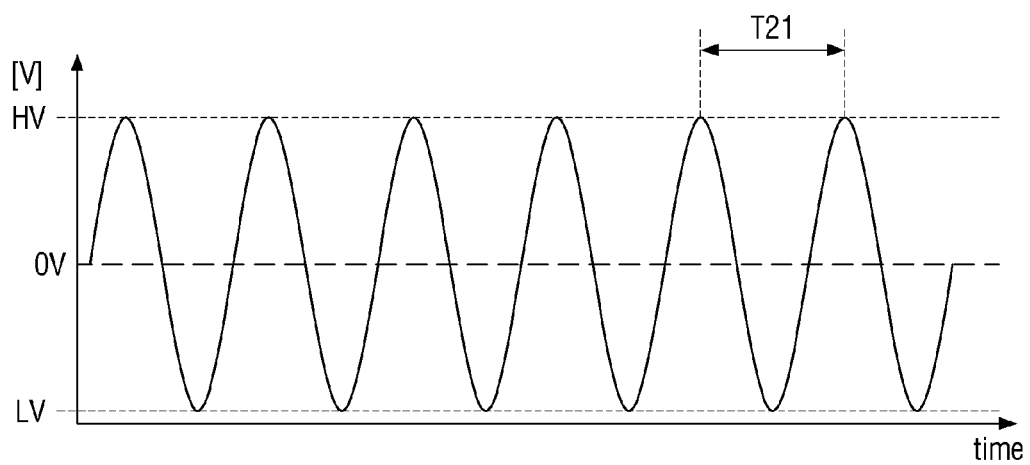
FIGS. 20A to 20C are waveform diagrams illustrating examples of a second AC voltage having a symmetric waveform.
Figure 20B:
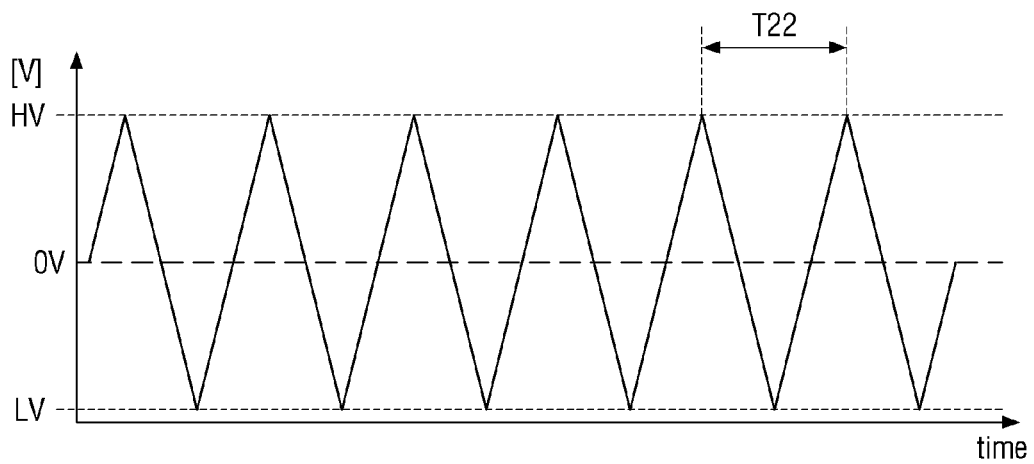
Figure 20C:
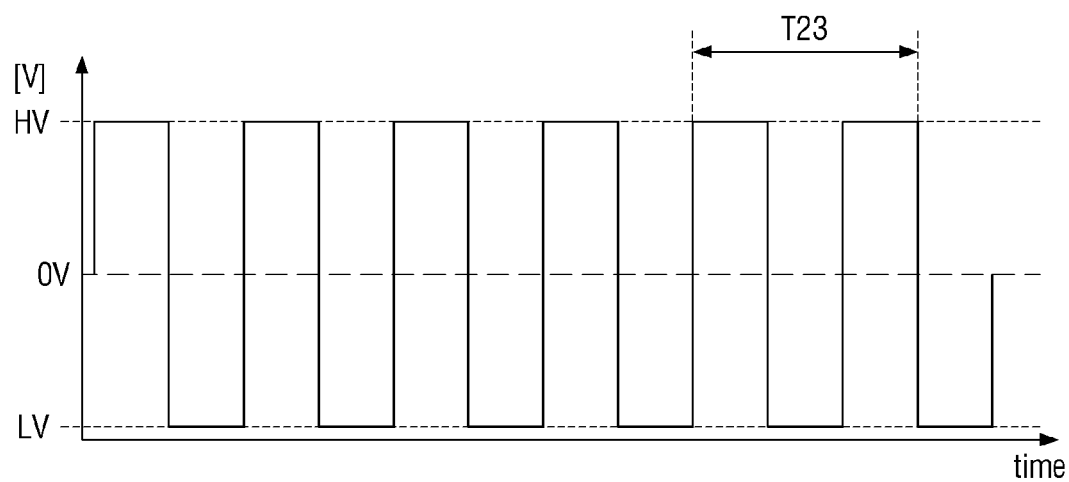

FIGS. 20A to 20C are waveform diagrams illustrating examples of a second AC voltage of a high frequency.

In FIGS. 20A to 20C, X-axis indicates time, and Y-axis indicates a voltage level. It is illustrated in FIGS. 20A to 20C that the second AC voltage has the highest level voltage HV and the lowest level voltage LV. In this case, the highest level voltage HV is about 20 V, and the lowest level voltage LV is about-20 V, but the disclosure is not limited thereto.

As shown in FIGS. 20A to 20C, the second AC voltage having a symmetric waveform is an AC voltage in which the voltage waveform of the positive polarity region of the first AC voltage and the voltage waveform of the negative polarity region of the first AC voltage are left-right symmetric. In FIGS. 20A to 20C, the positive polarity region of the second AC voltage indicates a region in which the second AC voltage is about 0 V or greater, and the negative polarity region of the second AC voltage indicates a region in which the second AC voltage is less than about 0 V.

The second AC voltage may have a sinusoidal waveform as shown in FIG. 20A, a triangular form as shown in FIG. 20B, or a spherical waveform as shown in FIG. 20C.

The second AC voltage having a symmetric waveform according to an embodiment is not limited to the examples shown in FIGS. 20A to 20C.

Although preferred embodiments of the present invention have been described for illustrative purposes, those skilled in the art will appreciate that various modifications, additions and substitutions are possible, without departing from the scope and spirit of the claimed invention as disclosed in the accompanying claims.

What is claimed is:

1. A method of aligning light emitting elements, comprising:
applying a ground voltage to a first electrode and applying a first alternating current (AC) voltage to a second electrode spaced apart from the first electrode, the first AC voltage having an asymmetric waveform;
applying a ground voltage to the first electrode and applying a second AC voltage to the second electrode, the second AC voltage having a symmetric waveform; and
aligning light emitting elements between the first electrode and the second electrode, wherein
in response to a ground voltage being applied to the first electrode and a first AC voltage being applied to the second electrode spaced apart from the first electrode, an electric field formed by the first electrode and the second electrode is an asymmetric electric field in which any one of positive polarity and negative polarity is dominant.

2. The method of claim 1, wherein a voltage waveform of a positive polarity region of the first AC voltage and a voltage waveform of a negative polarity region of the first AC voltage are left-right asymmetric.

3. The method of claim 1, wherein the first AC voltage has a sawtooth waveform or a ramp waveform.

4. The method of claim 1, wherein a voltage waveform of a positive polarity region of the second AC voltage and a voltage waveform of a negative polarity region of the second AC voltage are left-right symmetric.

5. The method of claim 1, wherein the second AC voltage has a sinusoidal waveform, a spherical waveform, or a triangular waveform.

6. The method of claim 1, wherein a driving frequency of the first AC voltage is lower than a driving frequency of the second AC voltage.

7. The method of claim 6, wherein the first AC voltage has a driving frequency of about 1 Hz to about 1 kHz.

8. The method of claim 6, wherein the second AC voltage has a driving frequency of about 1 kHz to about 100 kHz.

9. A method of manufacturing a display device, comprising:
forming partition wall, a first electrode, and a second electrode on a substrate;

applying a coating solution containing light emitting elements onto sub-pixels;

forming an electric field between the first electrode and the second electrode to align the light emitting elements;

removing the coating solution;

forming first connection electrodes electrically connecting the first electrode to an end of each of the light emitting elements; and forming second connection electrodes electrically connecting the second electrode to another end of each of the light emitting elements, wherein the forming of the electric field between the first electrode and the second electrode to align the light emitting elements include:

applying a ground voltage to the first electrode; and
applying a first alternating current (AC) voltage having an asymmetric waveform to the second electrode; and applying a ground voltage to the first electrode and applying a second AC voltage to the second electrode, wherein in response to applying a ground voltage to the first electrode and applying a first AC voltage to the second electrode spaced apart from the first electrode, an electric field formed by the first electrode and the second electrode is an asymmetric electric field in which any one of positive polarity and negative polarity is dominant.

10. The method of claim 9, wherein in case that a ground voltage is applied to the first electrode and a first AC voltage is applied to the second electrode, the light emitting elements are disposed toward the first electrode.

11. The method of claim 9, wherein
each of the light emitting elements includes:
a first conductive semiconductor disposed at the another end of each of the light emitting elements; and
a second conductive semiconductor disposed at the end of each of the light emitting elements,
the first conductive semiconductor is disposed adjacent to the second electrode, and
the second conductive semiconductor is disposed adjacent to the first electrode.

12. The method of claim 11, wherein
the first conductive semiconductor is an n-type semiconductor layer, and
the second conductive semiconductor is a p-type semiconductor layer.

13. The method of claim 9, wherein in case that a ground voltage is applied to the first electrode and a second AC voltage is applied to the second electrode, the light emitting elements are aligned at a center between the first electrode and the second electrode.

14. The method of claim 9, wherein the second AC voltage has a symmetric waveform.

15. The method of claim 9, wherein a driving frequency of the first AC voltage is lower than a driving frequency of the second AC voltage.

16. The method of claim 9, further comprising:
electrically disconnecting the first electrode after the forming of the second connection electrodes to form a first electrode for each of the sub-pixels.

17. The method of claim 9, wherein the removing of the coating solution includes volatilizing the coating solution.

* * * * *